United States Patent
Iguchi et al.

(10) Patent No.: US 12,521,919 B2
(45) Date of Patent: Jan. 13, 2026

(54) ANISOTROPIC FILM AND METHOD FOR MANUFACTURING ANISOTROPIC FILM

(71) Applicant: SHIN-ETSU CHEMICAL CO., LTD., Tokyo (JP)

(72) Inventors: Hiroyuki Iguchi, Annaka (JP); Toshio Shiobara, Annaka (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/417,333

(22) Filed: Jan. 19, 2024

(65) Prior Publication Data

US 2024/0286321 A1    Aug. 29, 2024

Related U.S. Application Data

(62) Division of application No. 16/688,188, filed on Nov. 19, 2019, now abandoned.

(30) Foreign Application Priority Data

| Nov. 21, 2018 | (JP) | 2018-218535 |
| Nov. 21, 2018 | (JP) | 2018-218588 |
| Apr. 1, 2019 | (JP) | 2019-069802 |
| Apr. 1, 2019 | (JP) | 2019-069823 |

(51) Int. Cl.
| B29C 43/02 | (2006.01) |
| B29C 43/00 | (2006.01) |
| B29K 79/00 | (2006.01) |
| B29K 509/00 | (2006.01) |

(Continued)

(52) U.S. Cl.
CPC .......... *B29C 43/021* (2013.01); *B29C 43/003* (2013.01); *H01B 1/22* (2013.01); *B29K 2079/08* (2013.01); *B29K 2509/00* (2013.01); *B29K 2883/00* (2013.01); *B29L 2031/3475* (2013.01)

(58) Field of Classification Search
None
See application file for complete search history.

(56) References Cited

U.S. PATENT DOCUMENTS

| 4,451,535 A | 5/1984 | Pingaud et al. |
| 2007/0054984 A1 | 3/2007 | Jun et al. |
| 2007/0281740 A1 | 12/2007 | Sato et al. |

(Continued)

FOREIGN PATENT DOCUMENTS

| CN | 102782945 A | 11/2012 |
| CN | 104541417 A | 4/2015 |

(Continued)

OTHER PUBLICATIONS

JP 2002298945 A Eng trans (Year: 2002).*

(Continued)

*Primary Examiner* — Jeffrey D Washville
(74) *Attorney, Agent, or Firm* — Oliff PLC

(57) ABSTRACT

An anisotropic electro-conductive film having high reliability, which electrically connects circuit electrodes having a fine pattern. The anisotropic film contains an insulating resin and particle groups. The particle groups are groups of particles in which a plurality of particles are bound together with a binder. The particle groups are regularly arranged with an interval of 1 μm to 1,000 μm.

45 Claims, 8 Drawing Sheets

(51) Int. Cl.
B29L 31/34 (2006.01)
H01B 1/22 (2006.01)

(56) References Cited

U.S. PATENT DOCUMENTS

| | | |
|---|---|---|
| 2015/0319867 A1 | 11/2015 | Sato |
| 2017/0253783 A1 | 9/2017 | Naito et al. |
| 2017/0309590 A1 | 10/2017 | Tsukao |
| 2017/0317047 A1 | 11/2017 | Akutsu |
| 2018/0022968 A1 | 1/2018 | Yoshizawa et al. |
| 2018/0113361 A1 | 4/2018 | Lee et al. |
| 2018/0287273 A1 | 10/2018 | Kubode et al. |
| 2019/0106548 A1 | 4/2019 | Akutsu et al. |

FOREIGN PATENT DOCUMENTS

| | | | |
|---|---|---|---|
| CN | 106797082 A | 5/2017 | |
| CN | 107078420 A | 8/2017 | |
| CN | 107431294 A | 12/2017 | |
| CN | 108028477 A | 5/2018 | |
| JP | S57-501053 A | 6/1982 | |
| JP | H05-154857 A | 6/1993 | |
| JP | H11-339575 A | 12/1999 | |
| JP | 2001-185261 A | 7/2001 | |
| JP | 2002298945 A | * 10/2002 | |
| JP | 2004-238443 A | 8/2004 | |
| JP | 2004-335663 A | 11/2004 | |
| JP | 2005-209454 A | 8/2005 | |
| JP | 2006-093288 A | 4/2006 | |
| JP | 2008-112713 A | 5/2008 | |
| JP | 2011-222830 A | 11/2011 | |
| JP | 2012-188617 A | 10/2012 | |
| JP | 2014-063729 A | 4/2014 | |
| JP | 2014-067924 A | 4/2014 | |
| JP | 2015-147832 A | 8/2015 | |
| JP | WO2016/031212 A1 | 4/2017 | |
| JP | 2018-090768 A | 6/2018 | |
| KR | 2017-0123417 A | 11/2017 | |
| TW | 594066 B | 6/2004 | |
| TW | 200710878 A | 3/2007 | |
| TW | 201101343 A | 1/2011 | |
| TW | 201730896 A | * 9/2017 | ............... C08J 5/18 |
| WO | 2014/034741 A1 | 3/2014 | |
| WO | 2017/191772 A1 | 11/2017 | |

OTHER PUBLICATIONS

TW 201730896 A English trans (Year: 2017).*
Dec. 29, 2023 Office Action and Search Report issued in Chinese Patent Application No. 201911143991.8.
Mar. 1, 2022 Office Action issued in Japanese Patent Application No. 2019-069802.
Mar. 1, 2022 Office Action issued in Japanese Patent Application No. 2019-069823.
Aug. 30, 2022 Office Action issued in Japanese Patent Application No. 2019-69802.
Jan. 5, 2023 Office Action issued in Chinese Patent Application No. 2019-11143991.8.
Aug. 1, 2023 Office Action issued in Chinese Patent Application No. 201911143991.8.
Sep. 27, 2023 Office Action and Search Report issued in Taiwanese Patent Application No. 108142076.
Jul. 8, 2024 Office Action issued in Korean Patent Application No. 2019-0150400.

* cited by examiner

[FIG. 1]
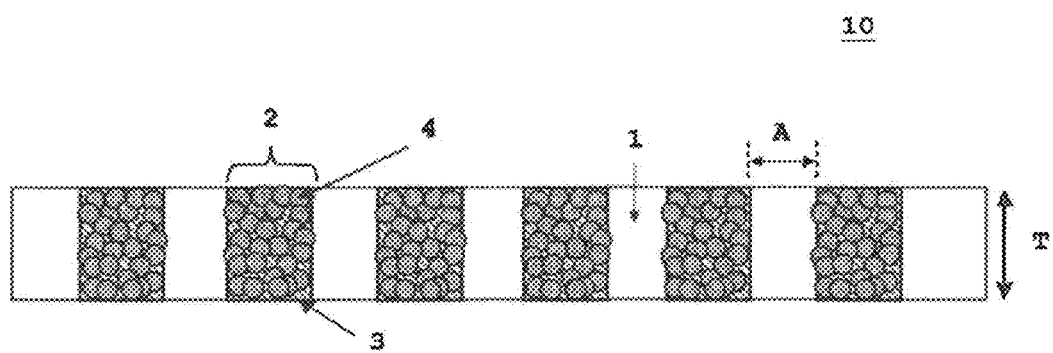
[FIG. 2]
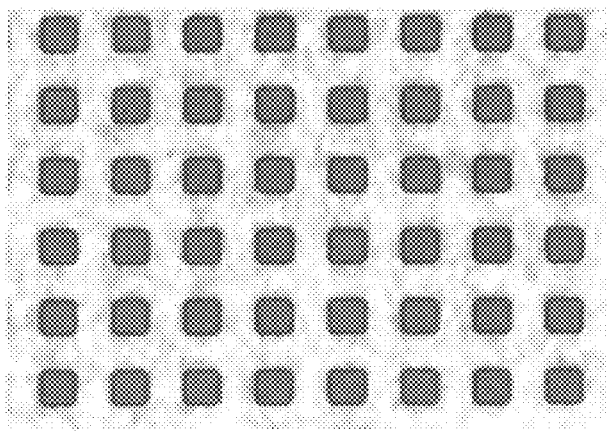

[FIG. 3]
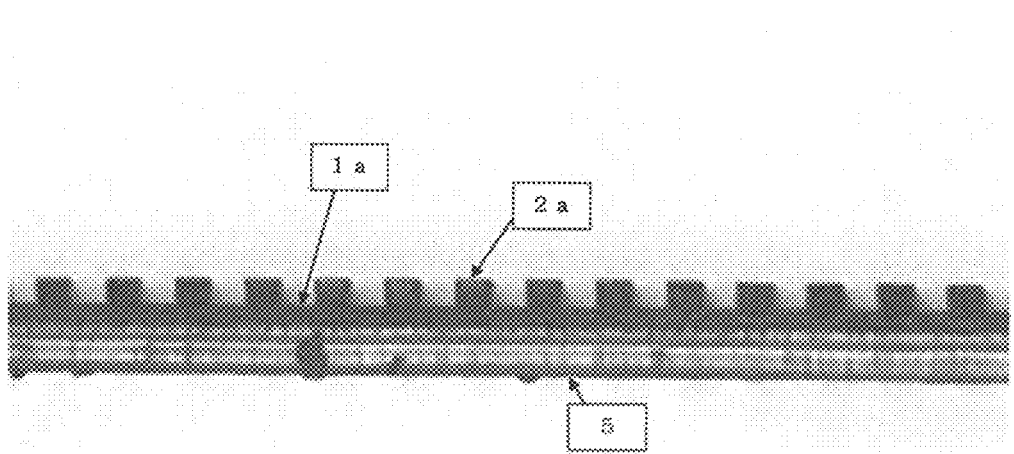
[FIG. 4-1]
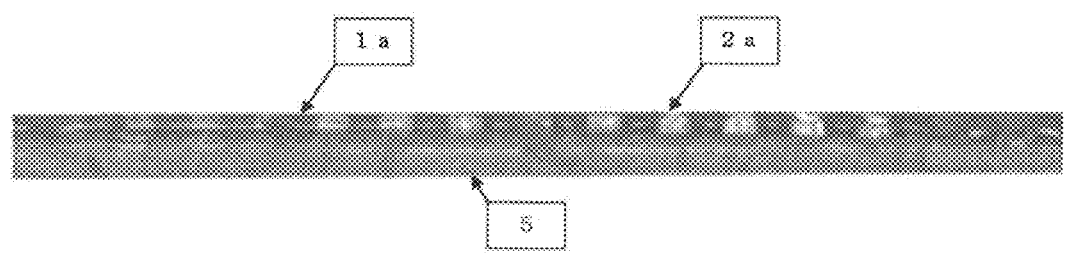

[FIG. 4-2]
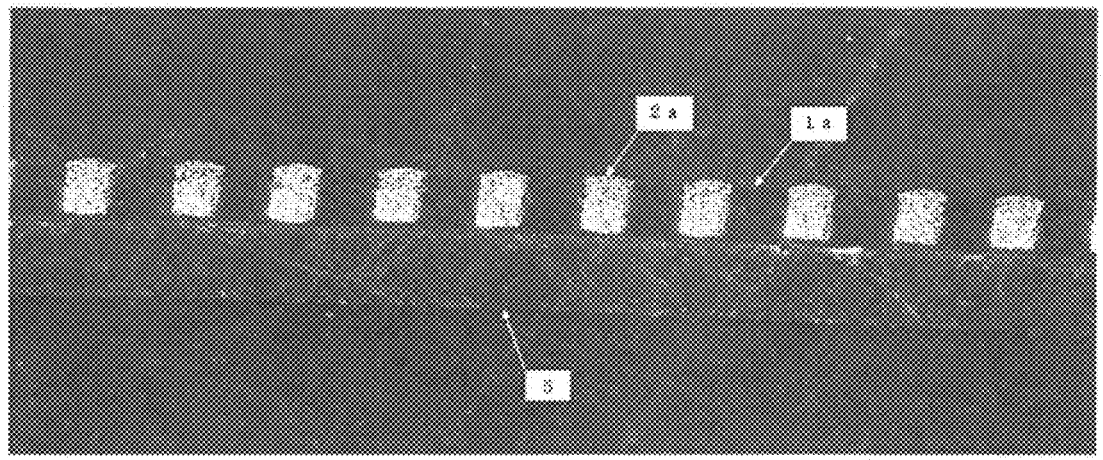
[FIG. 5]
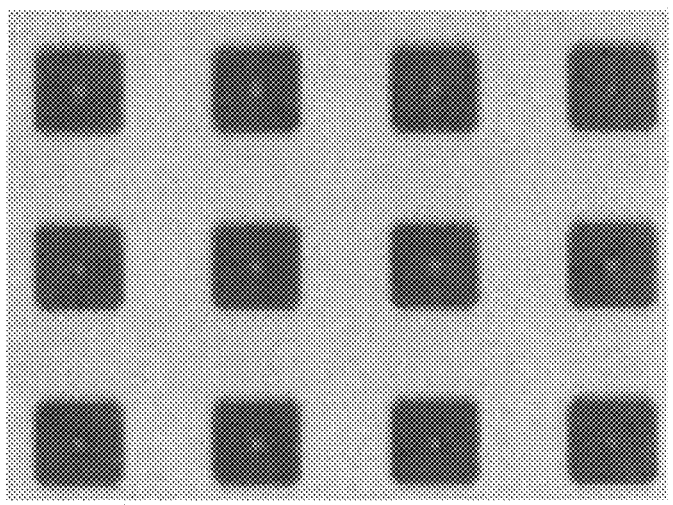
[FIG. 6]
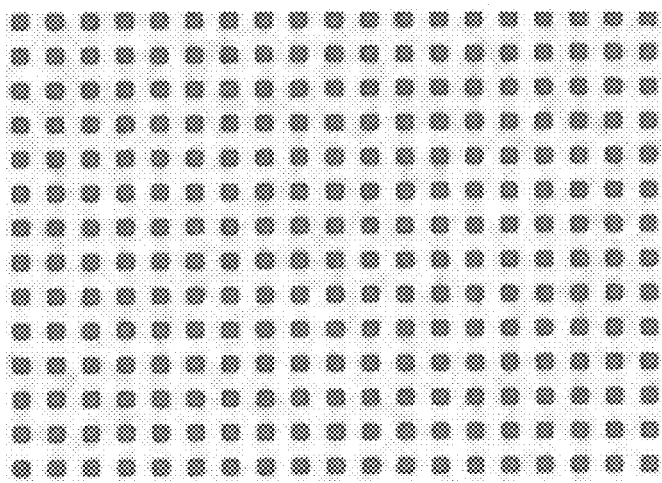

[FIG. 7]
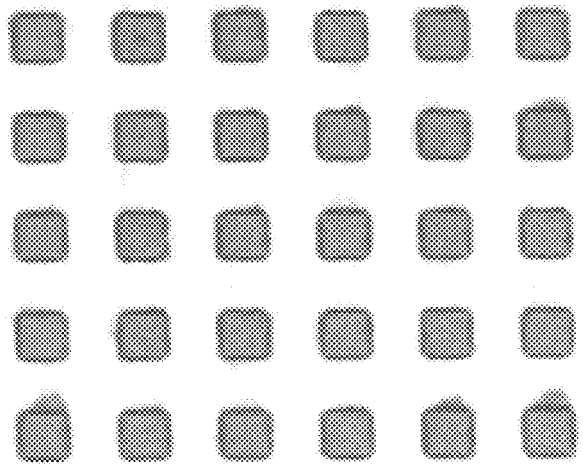
[FIG. 8]
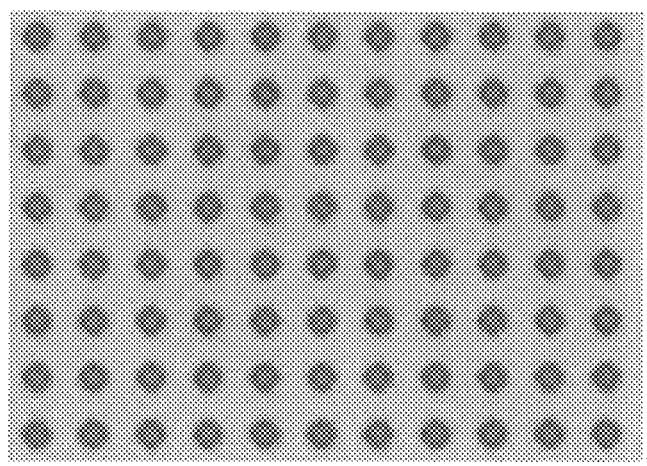
[FIG. 9]
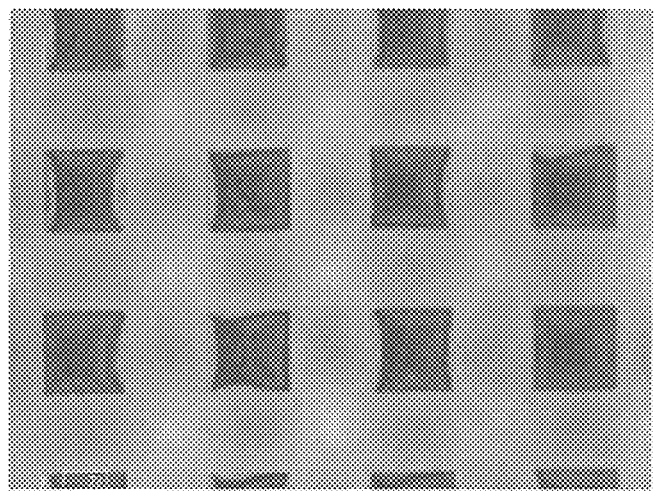

[FIG. 10]
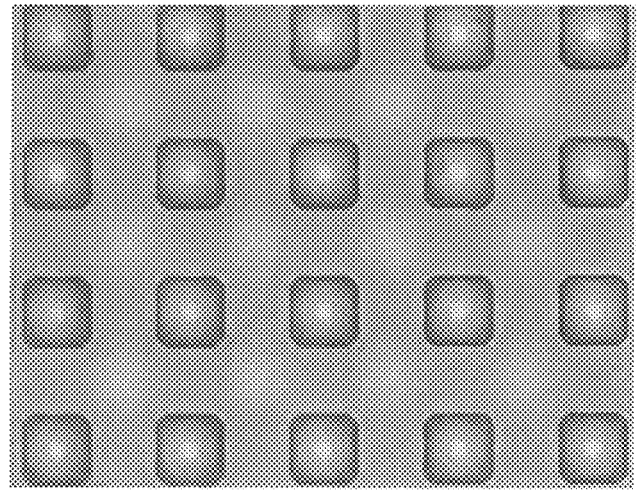
[FIG. 11]
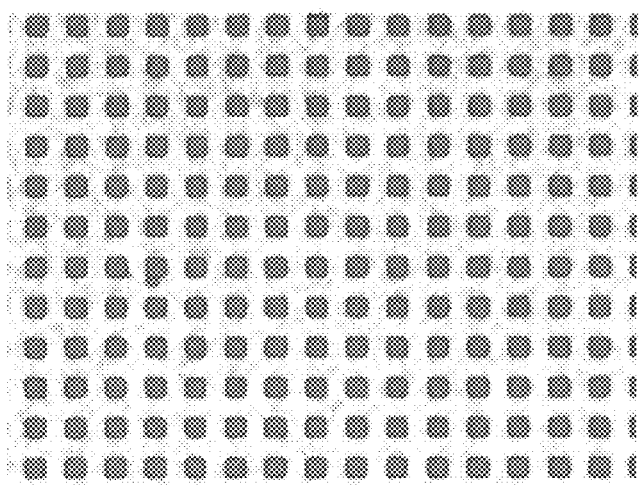
[FIG. 12]
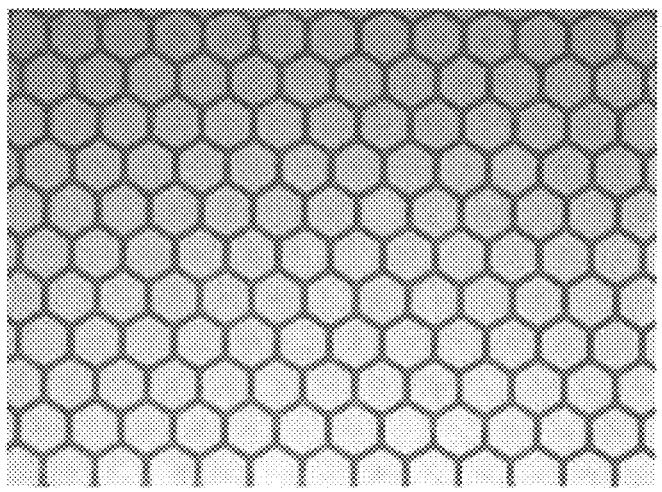

[FIG. 13]
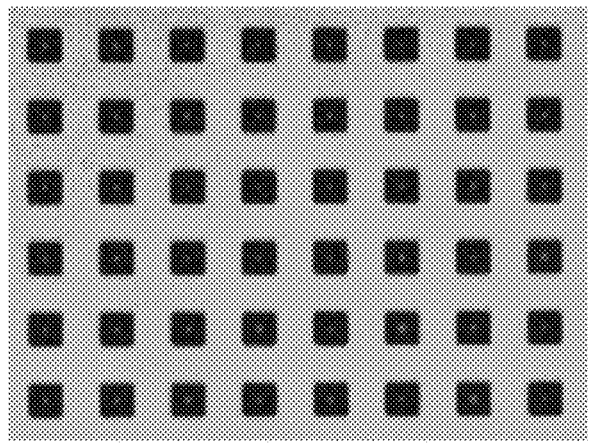
[FIG. 14]
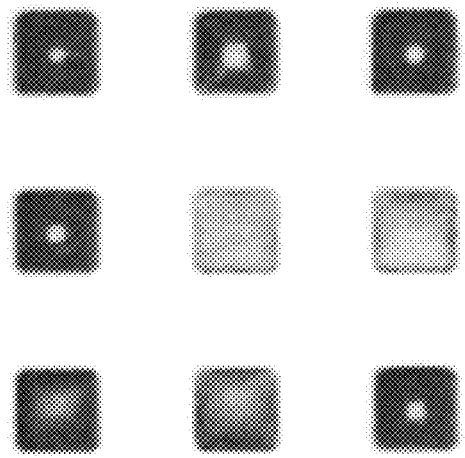
[FIG. 15]
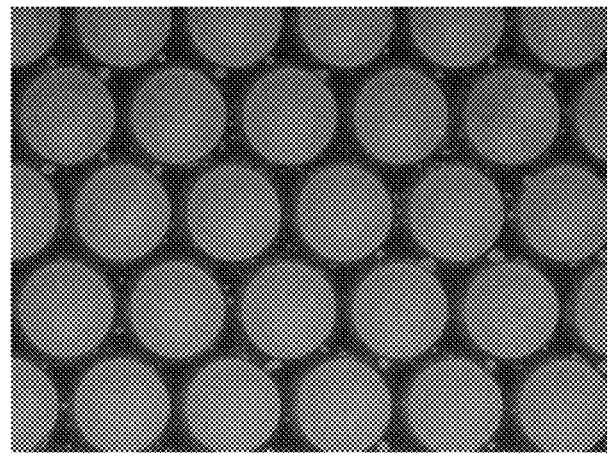

[FIG. 16]
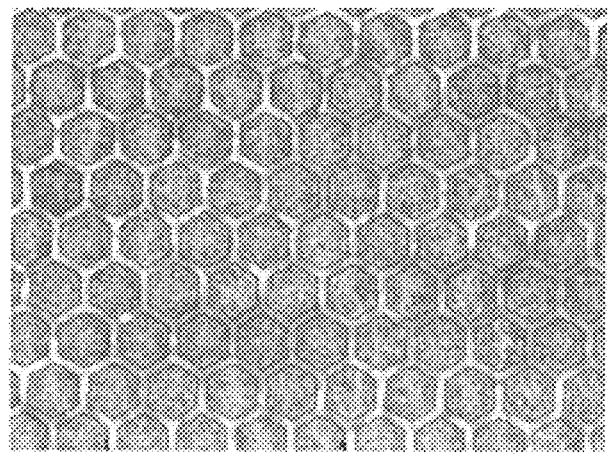
[FIG. 17]
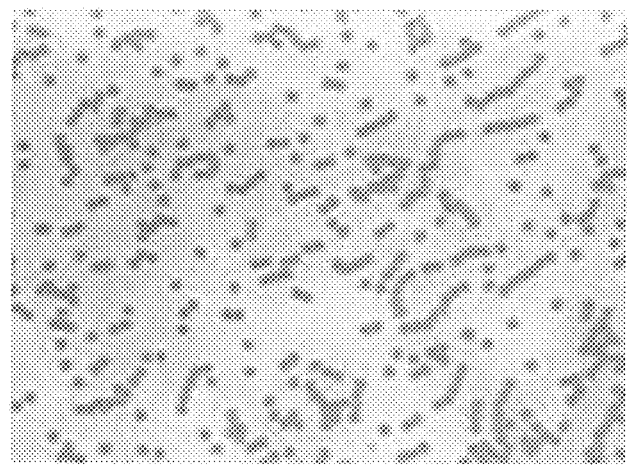
[FIG. 18]
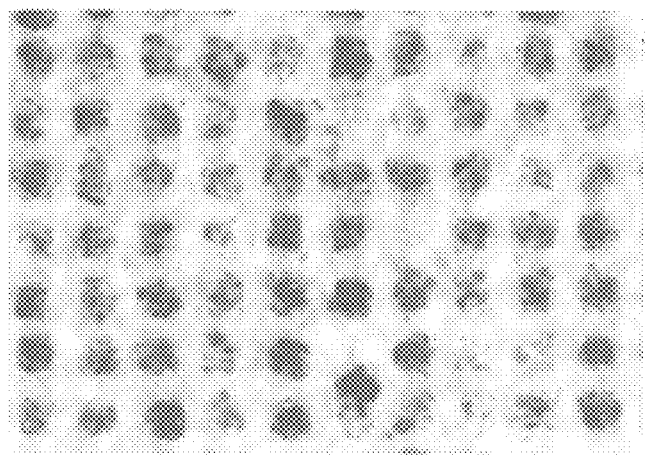

[FIG. 19]
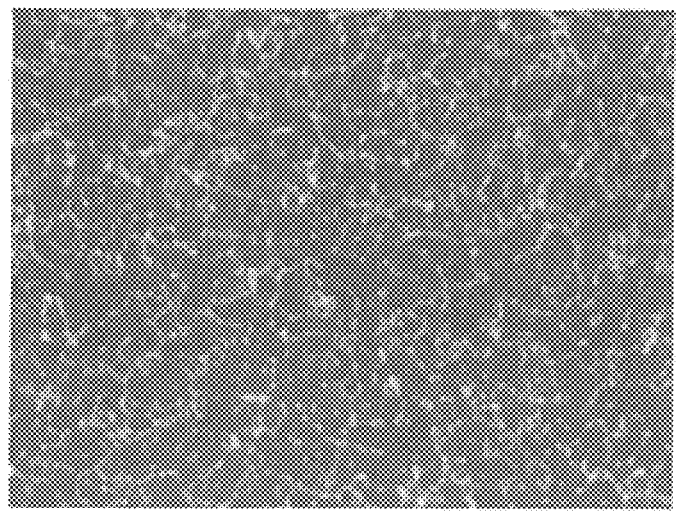
[FIG. 20]
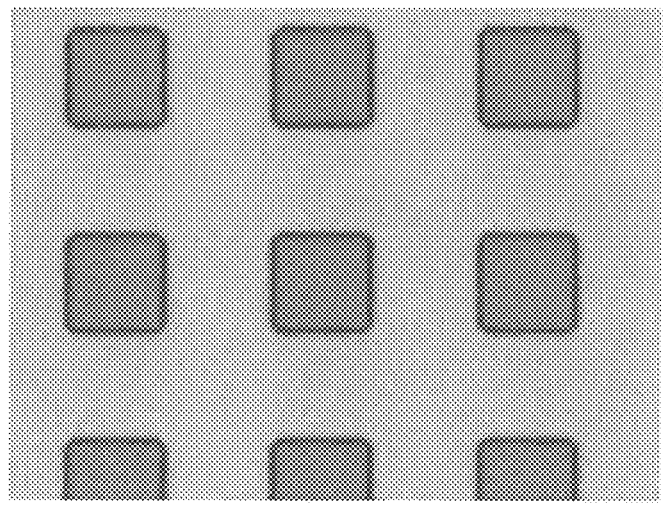

ANISOTROPIC FILM AND METHOD FOR MANUFACTURING ANISOTROPIC FILM

CROSS REFERENCE TO RELATED APPLICATIONS

This is a Division of application Ser. No. 16/688,188 filed Nov. 19, 2019, which claims priority to JP 2019-069802 and JP 2019-069823 each filed Apr. 1, 2019, and JP 2018-218535 and JP 2018-218588 each filed Nov. 21, 2018. The disclosure of the prior applications is hereby incorporated by reference herein in its entirety.

TECHNICAL FIELD

The present invention relates to an anisotropic film, in particular to an anisotropic electro-conductive film. Also, it relates to a method for manufacturing an anisotropic film, in particular to a method for manufacturing an anisotropic electro-conductive film.

BACKGROUND ART

In recent years, for connecting electronic parts of a flat panel display such as a liquid crystal display (LCD: Liquid Crystal Display), etc., or precision equipments, an anisotropic electro-conductive film (ACF: Anisotropic Conductive Film) has been used in place of a solder. The anisotropic electro-conductive film comprises an insulating resin containing electro-conductive particles, and can perform electric connection between circuits by being provided between circuit electrodes and crimped by pressurization and heating.

As a general manufacturing method of the anisotropic electro-conductive film, there is a method in which an insulating resin and electro-conductive particles are mixed and coated. In Patent Document 1, an anisotropic electro-conductive film is manufactured by coating a mixture of a polyvinyl butyral resin and an epoxy resin containing tin-lead solder particles having an average particle diameter of 10 µm and a maximum particle diameter of 15 µm. In Patent Document 2, an anisotropic electro-conductive film is manufactured by mixing nickel particles having an average particle diameter of 2 µm and a phenoxy resin, and by using a coating apparatus. In Patent Document 3, an anisotropic electro-conductive film is manufactured by mixing silver-plated resin particles having an average particle diameter of 20 µm with an insulating resin and coating the same.

However, these anisotropic electro-conductive films are difficult in dispersing particles uniformly since aggregation of the particles occurs, etc., so that it is difficult to retain the target electro-conductive region while maintaining the insulating property in the planar direction of the anisotropic electro-conductive film. When the concentration of the particles is low for preventing from aggregation of the particles, it is difficult to retain electric conductivity in the cross-sectional direction of the anisotropic electro-conductive film. Therefore, it could not electrically connect circuit electrodes having a fine pattern.

In Patent Document 4, it has been reported an anisotropic electro-conductive film in which electro-conductive particles are regularly arranged by adsorbing the electro-conductive particles to a porous plate having pores smaller than the particle diameter of the electro-conductive particles and transferring the same. In Patent Document 5, it has been reported an anisotropic electro-conductive film in which electro-conductive particles are regularly arranged by arranging the electro-conductive particles in a mold and transferring the same.

However, the circuit electrode is connected in contact with the electro-conductive particles at a point, so that it may sometimes become non-conductive due to thermal shock that repeats low temperature and high temperature.

CITATION LIST

Patent Literature

Patent Document 1: JP Hei. 5-154857A
Patent Document 2: JP 2008-112713A
Patent Document 3: JP 2015-147832A
Patent Document 4: JP 2005-209454A
Patent Document 5: JP 2018-090768A

SUMMARY OF INVENTION

Technical Problem

The present invention has been made to solve the above-mentioned problems, and an object thereof is to provide an anisotropic electro-conductive film having high reliability by electrically connecting circuit electrodes having fine pattern. Also, the present invention is not limited to the case of electric conductivity, and an object thereof is to provide an anisotropic film having a fine and accurate pattern by particle groups. Further, an object of the present invention is to provide a method for manufacturing an anisotropic electro-conductive film having high reliability in which electro-conductive particle groups are arranged at equal intervals in a film-state insulating resin composition. Moreover, in the present invention, it is not limited to the case of electric conductivity, and an object thereof is to provide a method for manufacturing an anisotropic film having a fine and accurate pattern by particles group.

Solution to Problem

To accomplish the above-mentioned tasks, in the present invention, there is provided an anisotropic film containing an insulating resin and particle groups, wherein the particle groups are groups of particles in which a plurality of particles are bound together with a binder, and the particle groups are regularly arranged with an interval of 1 µm to 1,000 µm.

When such an anisotropic film is produced, it becomes a material that can more stably connect circuit electrodes having a fine pattern, or fine electronic parts or devices, etc. Further, it is an anisotropic film having a fine and accurate pattern by the particle groups so that it can be applied to various uses.

Also, it is preferable that a difference in a linear expansion coefficient between the insulating resin and the particle groups at −50° C. to 200° C. is 1 to 200 ppm/K.

When the linear expansion coefficient is made such a difference, electronic parts are more difficultly detached from the anisotropic film even in the temperature change.

Further, the binder may be a resin composition having the same composition as the insulating resin.

When the same kind of a resin is used, the binder and the insulating resin are compatible, whereby strength of the anisotropic film can be heightened.

In addition, the binder may be a resin composition having a different composition from the insulating resin.

When the different kind of a resin is used, even when the composition (mixture of a binder and particles) contains particles, linear expansion coefficients of the composition and the insulating resin can be matched so that it is preferable.

Also, the particles may be electro-conductive particles, and the particle groups may be electro-conductive particle groups.

When the particles are such a material, the anisotropic film of the present invention can be made an anisotropic electro-conductive film having high reliability, which can electrically connect circuit electrodes having a fine pattern.

Further, the particles may be heat conductive particles, and the particle groups may be heat conductive particle groups.

When the particles are such a material, the anisotropic film of the present invention can be made an anisotropic heat conductive film.

Moreover, the particles may be phosphor, and the particle groups may be phosphor particle groups. When the particles are such a material, the anisotropic film of the present invention can be made an anisotropic phosphor film.

Furthermore, the particles may be magnetic particles, and the particle groups may be magnetic particle groups.

When the particles are such a material, the anisotropic film of the present invention can be made an anisotropic magnetic film.

Still further, the particles may be electromagnetic wave absorbing filler, and the particle groups may be electromagnetic wave absorbing filler particle groups.

When the particles are such a material, the anisotropic film of the present invention can be made an anisotropic electromagnetic wave absorbing film.

Also, it is preferable that a thickness of the anisotropic film is 1 µm to 2,000 µm.

When such an anisotropic film is produced, an effect by the difference in a coefficient of thermal expansion (CTE) between the insulating resin portion and the particle groups is small, so that the electronic parts are less likely detached from the anisotropic film.

Further, it is preferable that an average particle diameter of the particles is 0.01 to 100 µm as a median diameter measured by a laser diffraction type particle size distribution measurement apparatus.

When it is in this range, it is possible to highly fill the particles.

Moreover, it is preferable that the particle groups have a width of 1 to 1,000 µm.

When it is in this range, respective advantages of the insulating resin and the particle groups can be utilized, so that it is preferable.

Furthermore, it is preferable that a width of the particle groups of 5-fold or more of an average particle diameter of the particles.

When it is in this range, the function of the particles as the particle groups can be exhibited more reliably, so that it is preferable.

Still further, it is preferable that a theoretical average particle number of the particle groups is 50 to $1 \times 10^9$.

When it is in this range, the particle group can be made a pillar shape, so that it is preferable.

Also, it is preferable that a shape of the particle groups is a cylindrical shape or a prismatic shape.

When it is in this range, anisotropy as a function of the particle group can be easily exhibited, so that it is preferable.

Further, it is preferable that a ratio of an area of a lower surface of the particle groups to an area of an upper surface of the same is 0.5 to 10.

When it is in this range, anisotropy as a function of the particle group can be easily exhibited and production thereof is easy, so that it is preferable.

Moreover, it is preferable that a thickness of the particle groups is 50% or more of a thickness of the anisotropic film.

In this case, for example, when an electrode is pressed from above the completed anisotropic electro-conductive film, it becomes easy to ensure electric conduction.

Furthermore, it is preferable that the particle groups are exposed in at least one surface of the anisotropic film.

For example, by exposing the electro-conductive particle groups in at least one surface of the anisotropic electro-conductive film, it is possible to ensure conduction without thermo-compression bonding of the anisotropic electro-conductive film with a large force.

Still further, it is preferable that a ratio of an area of the exposed particle groups in the at least one surface is 20 to 90%.

When it is in this range, the anisotropic film can reliably exhibit the intended function while maintaining high flexibility.

Also, it is preferable that the insulating resin is a plastic solid or semi-solid-state at an uncured state at 25° C.

When the insulating resin has such a characteristic, for example, it can be deformed when electronic parts are crimped, and good adhesive force can be obtained when it is completely cured.

Further, it is preferable that the particles contain metal particles.

In the present invention, such particles can be suitably used. In particular, the metal particles have low electric resistance, and it is possible to calcinate at high temperature so that it is preferable.

Moreover, it is preferable that the insulating resin contains insulating inorganic particles.

By containing the insulating inorganic particles, a coefficient of thermal expansion of a cured product of the insulating resin can be lowered.

At this time, the insulating inorganic particles may be a white pigment.

When the insulating inorganic particles are such a material, the anisotropic film of the present invention can be made, for example, a reflector film.

Furthermore, the insulating resin may contain hollow particles.

By containing the hollow particles, the anisotropic film of the present invention can be made a hollow film.

Still further, it is preferable that a cured product of the insulating resin has a relative dielectric constant of 3.5 or less at 10 GHz.

When such a cured product is employed, for example, transmission loss of a circuit device can be reduced.

Also, the anisotropic film may be any of an electro-conductive film, a heat conductive film, a phosphor film, a magnetic film, an electromagnetic wave absorbing film, a reflector film and a hollow film.

The anisotropic film of the present invention can be used for such a use.

Further, in the present invention, it is provided a method for manufacturing an anisotropic film, which comprises
   (1) preparing a composition by mixing particles and a binder, and (2) filling the composition into a mold to which a concavo-convex pattern has been applied, to produce particle groups in which a plurality of the particles are bound together.

When such a method for manufacturing the anisotropic film is employed, various anisotropic films having high reliability in which the particle groups are arranged with equal intervals can be manufactured with good efficiency by utilizing a mold.

Moreover, it is preferable that, after the step (2), the method further comprises (3) transferring the particle groups to an uncured film-state insulating resin composition, and (4) pressing the particle groups transferred onto the film-state insulating resin composition to embed the particle groups into the film-state insulating resin composition.

When such a method for manufacturing the anisotropic film is employed, various anisotropic films having high reliability in which the particle groups are arranged with equal intervals in the film-state insulating resin composition can be manufactured with good efficiency by utilizing a mold and pressing after transferring.

Furthermore, a resin composition having the same composition as that of an insulating resin used in the Step (3) may be used as the binder used in the Step (1).

When the same kind of a resin is used, the binder and the film-state insulating resin can be compatible, so that strength of the anisotropic film can be heightened.

Still further, a resin composition having a different composition from that of an insulating resin used in the Step (3) may be used as the binder used in the Step (1).

When a different kind of a resin is used, even when the composition contains particles, linear expansion coefficients of the composition and the insulating resin can be matched, so that it is preferable.

Also, the particles may be electro-conductive particles, and the particle groups may be electro-conductive particle groups.

When such a method for manufacturing the anisotropic film is employed, an anisotropic electro-conductive film having good connection performance and high reliability in which the electro-conductive particle groups are arranged with equal intervals in the film-state insulating resin composition can be manufactured with good efficiency.

Further, the particles may be heat conductive particles, and the particle groups may be heat conductive particle groups.

In the method for manufacturing the anisotropic film of the present invention, an anisotropic heat conductive film can be manufactured.

Moreover, the particles may be phosphor, and the particle groups may be phosphor particle groups.

In the method for manufacturing the anisotropic film of the present invention, anisotropic phosphor film can be manufactured.

Furthermore, the particles may be magnetic particles, and the particle groups may be magnetic particle groups.

In the method for manufacturing the anisotropic film of the present invention, anisotropic magnetic film can be manufactured.

Still further, the particles may be electromagnetic wave absorbing filler, and the particle groups may be electromagnetic wave absorbing filler particle groups.

In the method for manufacturing the anisotropic film of the present invention, anisotropic electromagnetic wave absorbing film can be manufactured.

Also, it is preferable that, a plastic solid or semi-solid-state material at an uncured state at 25° C. is used as an insulating resin to be used in the Step (3).

When the insulating resin has such a characteristic, it can be deformed when the electronic parts are crimped, and good adhesive force can be obtained when it is completely cured.

Further, it is preferable that a material containing insulating inorganic particles is used as an insulating resin to be used in the Step (3).

By containing the insulating inorganic particles, a coefficient of thermal expansion of a cured product of the insulating resin can be lowered.

Moreover, the insulating inorganic particles may be a white pigment.

In the method for manufacturing the anisotropic film of the present invention, for example, a reflector film can be manufactured.

Furthermore, a material containing hollow particles may be used as an insulating resin to be used in the Step (3).

In the method for manufacturing the anisotropic film of the present invention, for example, a hollow film can be manufactured.

Still further, as the mold, it is preferable that a mold which has a concavo-convex pattern so that an interval of adjacent two among the particle groups embedded in the anisotropic film is 1 μm to 1,000 μm is used as the mold.

When such a mold is used, it is possible to regularly arrange the particle groups.

Also, an average particle diameter of the particles is preferably 0.01 to 100 μm as a median diameter measured by a laser diffraction type particle size distribution measurement apparatus.

When it is in this range, it is possible to highly fill the particles.

Further, it is preferable that the particle groups have a width of 1 to 1,000 μm.

When it is in this range, respective advantages of the insulating resin and the particle group can be utilized, so that it is preferable.

Moreover, it is preferable that a width of the particle group is 5-fold or more of an average particle diameter of the particles.

When it is in this range, the function of the particles as the particle group can be exhibited more reliably, so that it is preferable.

Furthermore, it is preferable that a theoretical average particle number of the particle groups is 50 to $1 \times 10^9$.

When it is in this range, the particle groups can be formed to a pillar shape so that it is preferable. Still further, it is preferable that a shape of the particle groups is a cylindrical shape or a prismatic shape.

When it is in this range, anisotropy as a function of the particle group can be easily exhibited, so that it is preferable.

Also, it is preferable that a ratio of an area of a lower surface of the particle groups to an area of an upper surface of the same is 0.5 to 10.

When it is in this range, anisotropy as a function of the particle group can be easily exhibited and manufacture is also easy so that it is preferable.

Further, it is preferable that a thickness of the particle groups is 50% or more of a thickness of the anisotropic film.

In this case, for example, when an electrode is pressed from above the completed anisotropic conductive film, it becomes easy to ensure electric conduction.

Moreover, it is preferable that the particle groups are exposed in at least one surface of the anisotropic film.

For example, by exposing the electro-conductive particle group in at least one surface of the anisotropic electro-conductive film, it is possible to ensure conduction without thermo-compression bonding of the anisotropic electro-conductive film with a large force.

At this time, it is preferable that a ratio of an area of the exposed particle groups in the at least one surface is 20 to 90%.

When it is in this range, the anisotropic film can reliably exhibit the intended function while maintaining high flexibility.

Furthermore, it is preferable that the anisotropic film is any of an electro-conductive film, a heat conductive film, a phosphor film, a magnetic film, an electromagnetic wave absorbing film, a reflector film and a hollow film.

The anisotropic film of the present invention can be used for such a use.

Advantageous Effects of Invention

As state above, the present invention relates to an anisotropic film having a fine and accurate pattern by the particle groups, so that it is applicable to various uses. In particular, the present invention is to provide an anisotropic electro-conductive film having high reliability, which can electrically connect circuit electrodes having extremely fine patterns, whereby achieving downsizing, thinning, and weight reduction of electronic devices, and high reliability capable of withstanding thermal shock, etc. Also, the present invention is to provide a method for manufacturing an anisotropic electro-conductive film having high reliability, which can electrically connect circuit electrodes having extremely fine patterns, whereby achieving downsizing, thinning, and weight reduction of electronic devices, and high reliability capable of withstanding thermal shock, etc. Further, the present invention is not limited to the case of electrical conductivity, and to provide a method for manufacturing various anisotropic films having high reliability and a fine and accurate pattern by particle groups.

BRIEF DESCRIPTION OF DRAWINGS

FIG. 1 is an image diagram showing an example of an anisotropic electro-conductive film of the present invention or an anisotropic electro-conductive film manufactured by the manufacturing method of the present invention.

FIG. 2 is a top view of an anisotropic electro-conductive film manufactured in Example 1 having a film thickness of 30 μm, and a pattern of silver particle groups having a width of 30 μm, a thickness of 30 μm and an interval of 30 μm.

FIG. 3 is a cross-sectional view of a film manufactured in Example 1 after transferring silver particle groups.

FIG. 4-1 is a cross-sectional view of a film manufactured in Example 1 after subjecting to hot-pressing and pushing silver particle groups into the film.

FIG. 4-2 is an enlarged view of a part of the cross-sectional view of FIG. 4-1.

FIG. 5 is a top view of an anisotropic electro-conductive film manufactured in Example 2 having a film thickness of 200 μm, and a pattern of copper particle groups having a width of 80 μm, a thickness of 100 μm and an interval of 80 μm.

FIG. 6 is a top view of an anisotropic electro-conductive film manufactured in Example 3 having a film thickness of 10 μm, and a pattern of silver particle groups having a width of 5 μm, a thickness of 5 μm and an interval of 5 μm.

FIG. 7 is a top view of an anisotropic electro-conductive film manufactured in Example 4 having a film thickness of 100 μm, and a pattern of silver particle groups having a width of 80 μm, a thickness of 80 μm and an interval of 80 μm.

FIG. 8 is a top view of an anisotropic electro-conductive film manufactured in Example 5 having a film thickness of 3 μm, and a pattern of silver particle groups having a width of 1 μm, a thickness of 2 μm and an interval of 1.5 μm.

FIG. 9 is a top view of am anisotropic electro-conductive film manufactured in Example 6 having a film thickness of 500 μm, and a pattern of copper particle groups having a width of 1,000 μm, a thickness of 500 μm and an interval of 1,000 μm.

FIG. 10 is a top view of an anisotropic electro-conductive film manufactured in Example 7 having a film thickness of 600 μm, and a pattern of silver particle groups having a width of 500 μm, a thickness of 500 μm and an interval of 500 μm.

FIG. 11 is a top view of an anisotropic electro-conductive film manufactured in Example 8 having a film thickness of 20 μm, and a pattern of copper particle groups having a width of 5 μm, a thickness of 5 μm and an interval of 5 μm.

FIG. 12 is a top view of an anisotropic heat conductive film manufactured in Example 9 having a film thickness of 500 μm, and a pattern of heat conductive particle groups having a width of 500 μm, a thickness of 500 μm and an interval of 50 μm.

FIG. 13 is a top view of an anisotropic phosphor film manufactured in Example 10 having a film thickness of 40 μm, and a pattern of phosphor particle groups having a width of 40 μm, a thickness of 40 μm and an interval of 40 μm.

FIG. 14 is a top view of an anisotropic phosphor film manufactured in Example 11 having a film thickness of 30 μm, and a pattern of phosphor particle groups having a width of 30 μm, a thickness of 30 μm and an interval of 30 μm.

FIG. 15 is a top view of an anisotropic magnetic film manufactured in Example 12 having a film thickness of 2,000 μm, and a pattern of magnetic particle groups having a width of 800 μm, a thickness of 1,500 μm and an interval of 100 μm.

FIG. 16 is a top view of an anisotropic electromagnetic wave absorbing film manufactured in Example 13 having a film thickness of 100 μm, and a pattern of electromagnetic wave absorbing particle groups having a width of 200 μm, a thickness of 100 μm and an interval of 40 μm.

FIG. 17 is a top view of a film manufactured in Comparative Example 1 having a film thickness of 8 μm in which electro-conductive particles sparsely present.

FIG. 18 is a top view of a film manufactured in Comparative Example 2 having a film thickness of 30 μm in which silver particles sparsely present.

FIG. 19 is a top view of a film manufactured in Comparative Example 3 having a film thickness of 2 μm in which silver particles are attached.

FIG. 20 is a top view of an anisotropic electro-conductive film manufactured in Comparative Example 4 having a film thickness of 200 μm, and a pattern of silver particle groups having a width of 1,200 μm, a thickness of 200 μm and an interval of 1,200 μm.

DESCRIPTION OF EMBODIMENTS

As mentioned above, it has been desired to develop an anisotropic electro-conductive film having high reliability which can electrically connect circuit electrodes having a fine pattern. In addition, it has been desired to develop an anisotropic film having a fine and accurate pattern by particle groups, which is not limited to the case of electrical conductivity. Further, it has been desired to develop a method for manufacturing an anisotropic electro-conductive film having high reliability in which electro-conductive particle groups are arranged with equal intervals in a film-state insulating resin composition.

The present inventors have intensively studied to accomplish the above-mentioned objects, and as a result, they have found that if an anisotropic electro-conductive film containing an insulating resin and electro-conductive particle groups, wherein the electro-conductive particle groups contain electro-conductive particles bound by a binder, and the electro-conductive particle groups are regularly arranged and an interval thereof is 1 μm to 1,000 μm, is employed, circuit electrodes having a fine pattern can be electrically connected to each other without causing short-circuit, whereby they have accomplished the present invention.

In addition, the present inventors have found that if a method for manufacturing an anisotropic electro-conductive film which comprises
(1) mixing electro-conductive particles and a binder to prepare an electro-conductive composition,
(2) filling the electro-conductive composition into a mold to which a concavo-convex pattern has been provided to prepare electro-conductive particle groups,
(3) transferring the electro-conductive particle groups to an uncured film-state insulating resin composition, and
(4) pressing the transferred electro-conductive particle groups onto the film-state insulating resin composition to embed them into the film-state insulating resin composition is employed, then an anisotropic electro-conductive film having high reliability in which the electro-conductive particle groups are arranged with equal intervals in the film-state insulating resin composition can be formed, whereby they have accomplished the present invention.

That is, the present invention relates to an anisotropic film which comprises an insulating resin and particle groups, wherein the particle groups are groups of particles in which a plurality of particles are bound together with a binder, and the particle groups are regularly arranged with an interval of 1 μm to 1,000 μm. In addition, the present invention relates to a method for manufacturing an anisotropic film, which comprises (1) preparing a composition by mixing particles and a binder, and (2) filling the composition into a mold to which a concavo-convex pattern has been provided to produce particle groups in which a plurality of the particles are bound together. Hereinafter, the present invention will be explained in detail, but the present invention is not limited by these.

<<Anisotropic Film>>

In the present invention, it is provided an anisotropic film containing an insulating resin and particle groups, wherein the particle groups are groups of particles in which a plurality of particles are bound together with a binder, and the particle groups are regularly arranged with an interval of 1 μm to 1,000 μm.

In the following, embodiments in which the particles are electro-conductive particles, the particle groups are electro-conductive particle groups and the anisotropic film is made an anisotropic electro-conductive film are mentioned as examples and explained. However, these embodiments can be similarly applied when the particles are heat conductive particles, phosphors, magnetic particles, electromagnetic wave absorbing fillers, etc.

FIG. 1 is an image diagram showing an example of an anisotropic electro-conductive film of the present invention. The anisotropic electro-conductive film 10 of the present invention contains an insulating resin 1 and electro-conductive particle groups 2. The electro-conductive particle groups 2 are characterized in that they contain electro-conductive particles 4 bound by a binder 3 and are regularly arranged, and an interval A thereof is 1 μm to 1,000 μm.

Hereinafter, each component of the anisotropic electro-conductive film 10 of the present invention will be described in detail.

[Insulating Resin]

The insulating resin 1 to be used in the present invention is not particularly limited, and may be mentioned a thermoplastic resin such as an acrylic resin, a polyester resin, a polyethylene resin, a cellulose resin, a styrene resin, a polyamide resin, a polyimide resin, a melamine resin, etc., a thermosetting resin such as a silicone resin, an epoxy resin, a silicone-epoxy resin, a maleimide resin, a phenol resin, a perfluoropolyether resin, etc., and when heat resistance and light resistance are taking into consideration, a thermosetting resin such as a silicone resin, an epoxy resin, a maleimide resin, etc., is preferable.

Further, the insulating resin 1 is preferably a plastic solid or semi-solid at 25° C. in an uncured or semi-solid-state which is the so-called B-stage, and more preferably a plastic solid or semi-solid in an uncured state at 25° C. When it has such a characteristic, it can be deformed when the electronic parts are crimped, and good adhesive force can be obtained when it is completely cured.

Incidentally, in the present specification, the term "semi-solid" means a state of a substance having plasticity and capable of maintaining a shape at least one hour, preferably 8 hours or longer when it is molded into a specific shape. Accordingly, for example, a flowable substance with an extremely high viscosity at 25° C. has essentially flowability, but change (that is, collapsed) in a provided shape cannot be observed with naked eyes in a short time of at least one hour due to the very high viscosity. In this case, the substance can be said to be in a semi-solid-state.

The insulating resin 1 may contain insulating inorganic particles. The insulating inorganic particles are not particularly limited and are, for example, silica, calcium carbonate, potassium titanate, glass fiber, silica balloon, glass balloon, aluminum oxide, aluminum nitride, boron nitride, beryllium oxide, barium titanate, barium sulfate, zinc oxide, titanium oxide, magnesium oxide, antimony oxide, aluminum hydroxide and magnesium hydroxide, etc., preferably silica, aluminum oxide, aluminum nitride, boron nitride and zinc oxide. By containing these insulating inorganic particles, a coefficient of thermal expansion of the cured product of the insulating resin 1 can be lowered.

The particle size of the insulating inorganic particles is not particularly limited, and is preferably 0.05 to 10 μm as a median diameter measured by a laser diffraction type particle size distribution measurement apparatus, more preferably 0.1 to 8 μm and further preferably 0.5 to 5 μm. If it is in this range, it can be easily dispersed in the insulating resin uniformly and is not sedimented with a lapse of time so that it is preferable. Further, the particle size of the insulating inorganic particles is preferably 50% or less based on a thickness of T of the anisotropic electro-conductive film 10. If the particle size is 50% or less based on the thickness of T of the anisotropic electro-conductive film 10, it is easy to uniformly disperse the insulating inorganic particles in the insulating resin 1, further it is also easy to evenly coat the anisotropic electro-conductive film 10 so that it is preferable.

A content of the insulating inorganic particles is not particularly limited, and it is preferably 30 to 95% by mass of the mass of the insulating resin 1, more preferably 40 to 90% by mass and further preferably 50 to 85% by mass. If it is in this range, a coefficient of thermal expansion of the insulating resin 1 can be effectively lowered and it does not become brittle after molding into a film state and completely curing so that it is preferable.

Also, it is preferable that the insulating resin 1 to be used in the present invention has a relative dielectric constant of the cured product of 3.5 or less at 10 GHz. If it is such a cured product, transmission loss can be reduced. Here, the relative dielectric constant refers to the value in which the insulating resin 1 is completely cured at 180° C. for 2 hours, the cured product is served as a test piece having a length of 30 mm, a width of 40 mm and a thickness of 100 μm, and the test piece is measured by connecting a network analyzer (E5063-2D5 manufactured by Keysight Technologies) and a stripline (manufactured by KEYCOM Corporation).

Hereinafter, specific examples of the insulating resin and the insulating inorganic particles to be used in the present invention are described. The insulating resin particularly preferably used in the present invention is, among those mentioned above, a silicone resin, an epoxy resin or a maleimide resin. In addition, particularly preferably used insulating inorganic particles are, among those mentioned above, a white pigment and hollow particles. Hereinafter, these are explained in more detail. Provided that the hollow particles are not limited to the inorganic particles.

<Silicone Resin>

In the present invention, the silicone resin which can be used as the insulating resin is not particularly limited and, for example, there may be mentioned an addition curing type silicone resin, a condensation curing type silicone resin, etc.

Examples of the addition curing type silicone resin are particularly preferably a composition comprising (A) an organosilicon compound having a non-conjugated double bond(s) (for example, an alkenyl group-containing diorganopolysiloxane), (B) an organohydrogen polysiloxane, and (C) a platinum-based catalyst as essential components. Hereinafter, these Components (A) to (C) are explained.

Component (a): Organosilicon Compound Having a Non-Conjugated Double Bond(s)

The organosilicon compound having a non-conjugated double bond(s) of Component (A) may be exemplified by an organopolysiloxane such as a linear diorganopolysiloxane in which both terminals of the molecular chain have been sealed by an aliphatic unsaturated group-containing triorganosiloxy group, represented by the following general formula (1), etc.

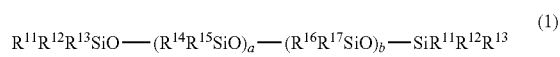

(wherein, $R^{11}$ represents a monovalent hydrocarbon group having a non-conjugated double bond(s), $R^{15}$ to $R^{17}$ each represent the same or different kind of a monovalent hydrocarbon group, and "a" and "b" are integers satisfying $0 \leq a \leq 500$, $0 \leq b \leq 250$, and $0 \leq a+b \leq 500$.)

In the above-mentioned general formula (1), $R^{11}$ is a monovalent hydrocarbon group having a non-conjugated double bond(s), preferably a monovalent hydrocarbon group having a non-conjugated double bond(s) having an aliphatic unsaturated bond represented by an alkenyl group having 2 to 8 carbon atoms, and particularly preferably 2 to 6 carbon atoms. Also, $R^{12}$ to $R^{17}$ each represent the same or different kind of a monovalent hydrocarbon group, and represent an alkyl group, an alkenyl group, an aryl group, and an aralkyl group, etc. preferably having 1 to 20 carbon atoms, particularly preferably 1 to 10 carbon atoms. Further, among these, $R^{14}$ to $R^{17}$ are more preferably a monovalent hydrocarbon group excluding an aliphatic unsaturated bond, particularly preferably an alkyl group, an aryl group, an aralkyl group, etc., having no aliphatic unsaturated bond such as an alkenyl group, etc. Moreover, among these, $R^{16}$ and $R^{17}$ are preferably an aromatic monovalent hydrocarbon group, and particularly preferably an aryl group having 6 to 12 carbon atoms such as a phenyl group, a tolyl group, etc.

In the above-mentioned general formula (1), "a" and "b" are integers satisfying $0 \leq a \leq 500$, $0 \leq b \leq 250$ and $0 \leq a+b \leq 500$, "a" is preferably $10 \leq a \leq 500$, "b" is preferably $0 \leq b \leq 150$, and "a"+"b" preferably satisfy $10 \leq a+b \leq 500$.

The organopolysiloxane represented by the above-mentioned general formula (1) can be obtained, for example, by an alkali equilibration reaction of a cyclic diorganopolysiloxane such as a cyclic diphenylpolysiloxane, a cyclic methylphenylpolysiloxane, etc., and a disiloxane constituting the terminal group such as diphenyltetravinyldisiloxane, divinyltetraphenyldisiloxane, etc., and in this case, in the equilibration reaction by an alkali catalyst (in particular, strong alkali such as KOH, etc.), polymerization proceeds by an irreversible reaction even with a small amount of the catalyst so that only a ring-opening polymerization quantitatively proceeds and a terminal sealing rate is also high, and thus, in general, a silanol group and a chlorine component are not contained.

As the organopolysiloxane represented by the above-mentioned general formula (1), the following are specifically exemplified.

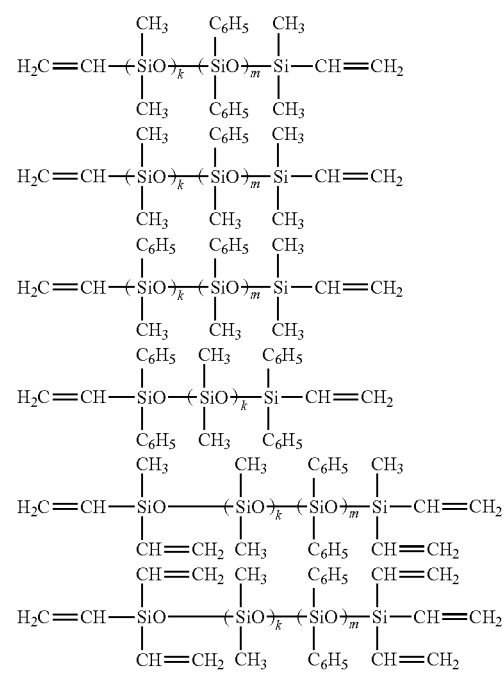

-continued

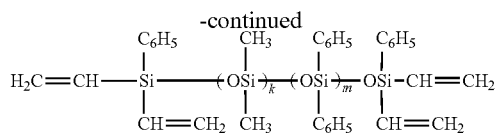

(in the above-mentioned formula, the repeating units "k" and "m" are integers satisfying $0 \leq k \leq 500$, $0 \leq m \leq 250$ and $0 \leq k+m \leq 500$, and preferably integers satisfying $5 \leq k+m \leq 250$ and $0 \leq m/(k+m) \leq 0.5$.)

As Component (A), in addition to the organopolysiloxane having a linear structure represented by the above-mentioned general formula (1), an organopolysiloxane having a three-dimensional network structure including a 3-functional siloxane unit, a 4-functional siloxane unit, etc. represented by the following general formula (2) may be used. The organosilicon compound having such a non-conjugated double bond(s) may be used with a single kind alone or may be used by mixing two or more kinds.

$$(R^8{}_3SiO_{1/2})_r(R^8{}_2SiO_{2/2})_s(R^8SiO_{3/2})_t(SiO_{4/2})_u \tag{2}$$

(wherein, $R^8$s each independently represent a group selected from a saturated hydrocarbon group having 1 to 12 carbon atoms, an aromatic hydrocarbon group having 6 to 12 carbon atoms and an alkenyl group having 2 to 10 carbon atoms, provided that at least two of the groups represented by $R^8$ are alkenyl groups, "r" is an integer of 0 to 100, "s" is an integer of 0 to 300, "t" is an integer of 0 to 200 and "u" is an integer of 0 to 200, and $1 \leq t+u \leq 400$, and $2 \leq r+s+t+u \leq 800$ are satisfied, provided that "r", "s", "t" and "u" are values in which the above-mentioned organopolysiloxane has at least two alkenyl groups in one molecule.)

The organopolysiloxane having a linear structure represented by the above-mentioned general formula (1) and the organopolysiloxane having a network structure represented by the above-mentioned general formula (2) may be each used singly or may be used in combination.

An amount of the group (for example, a monovalent hydrocarbon group having a double bond such as an alkenyl group, etc. bonding to the Si atoms) having a non-conjugated double bond(s) in the organosilicon compound having a non-conjugated double bond(s) of Component (A) is preferably 0.1 to 20 mol % in the whole monovalent hydrocarbon groups (all the monovalent hydrocarbon groups bonding to the Si atoms), more preferably 0.2 to 10 mol % and particularly preferably 0.2 to 5 mol %. If the amount of the group having a non-conjugated double bond(s) is 0.1 mol % or more, good cured product can be obtained when it is cured, while if it is 20 mol % or less, mechanical characteristics at the time of curing are good so that it is preferable.

Also, the organosilicon compound having a non-conjugated double bond(s) of Component (A) preferably has an aromatic monovalent hydrocarbon group (an aromatic monovalent hydrocarbon group bonding to the Si atoms), and a content of the aromatic monovalent hydrocarbon group is preferably 0 to 95 mol % to the whole monovalent hydrocarbon groups (all the monovalent hydrocarbon groups bonding to the Si atoms), more preferably 10 to 90 mol % and particularly preferably 20 to 80 mol %. When an appropriate amount of the aromatic monovalent hydrocarbon group is contained in the resin, there are merits that mechanical characteristics are good when it is cured and manufacture thereof is easy.

Component (B): Organohydrogen Polysiloxane

As Component (B), an organohydrogen polysiloxane having two or more hydrogen atoms bonded to a silicon atom (hereinafter referred to as "SiH group") in one molecule is preferable. If it is an organohydrogen polysiloxane having two or more SiH groups in one molecule, it acts as a cross-linking agent, and a cured product can be formed by subjecting to addition reaction of the SiH group in Component (B) and the non-conjugated double bond-containing group such as a vinyl group, and other alkenyl group, etc., in Component (A).

Further, the organohydrogen polysiloxane of Component (B) preferably has an aromatic monovalent hydrocarbon group. Thus, when such an organohydrogen polysiloxane having an aromatic monovalent hydrocarbon group is used, compatibility with the above-mentioned Component (A) can be heightened. Such an organohydrogen polysiloxane may be used with a single kind alone or may be used by mixing two or more kinds and, for example, the organohydrogen polysiloxane having an aromatic hydrocarbon group can be contained as a part or whole of Component (B).

The organohydrogen polysiloxane of Component (B) is not particularly limited, and may be mentioned, for example, 1,1,3,3-tetramethyldisiloxane, 1,3,5,7-tetramethylcyclotetrasiloxane, tris(dimethylhydrogensiloxy)-methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, both-terminal trimethylsiloxy group-sealed methylhydrogenpolysiloxane, both-terminal trimethylsiloxy group-sealed dimethylsiloxane·methylhydrogensiloxane copolymer, both-terminal dimethylhydrogensiloxy group-sealed dimethylpolysiloxane, both-terminal dimethylhydrogensiloxy group-sealed dimethylsiloxane·methylhydrogensiloxane copolymer, both-terminal trimethylsiloxy group-sealed methylhydrogensiloxane·diphenylsiloxane copolymer, both-terminal trimethylsiloxy group-sealed methylhydrogensiloxane·diphenylsiloxane·dimethylsiloxane copolymer, trimethoxysilane polymer, a copolymer comprising a $(CH_3)_2HSiO_{1/2}$ unit and an $SiO_{4/2}$ unit, a copolymer comprising a $(CH_3)HSiO_{2/2}$ unit, a $(CH_3)_2SiO_{2/2}$ and a $(C_6H_5)SiO_{3/2}$ unit, a copolymer comprising a $(CH_3)_2HSiO_{1/2}$ unit, a $SiO_{4/2}$ unit and a $(C_6H_5) SiO_{3/2}$ unit, etc.

Further, a compound represented by the following structure, or an organohydrogen polysiloxane obtained by using these compounds as a material can be also used.

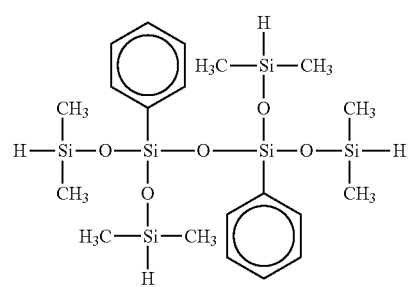

-continued

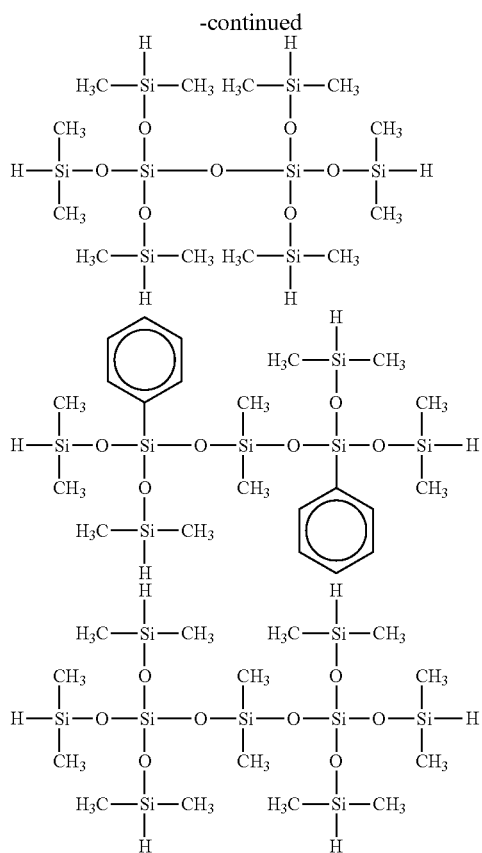

A molecular structure of the organohydrogen polysiloxane of Component (B) may be either of a linear, a cyclic, a branched, or a three-dimensional network structure, and a number of the silicon atoms in one molecule (or a polymerization degree in the case of a polymer) is preferably 2 or more, more preferably 3 to 500 and particularly preferably 4 to 300 or so.

A formulation amount of the organohydrogen polysiloxane of Component (B) is preferably such an amount that the SiH group in Component (B) is 0.7 to 3.0 per one group having a non-conjugated double bond(s) such as an alkenyl group, etc., of Component (A), and particularly preferably 1.0 to 2.0.

Component (C): Platinum-Based Catalyst

The platinum-based catalyst of Component (C) may be mentioned, for example, chloroplatinic acid, an alcohol-modified chloroplatinic acid, a platinum complex having a chelate structure, etc. These may be used with a single kind alone or a combination of two or more kinds.

A formulation amount of the platinum-based catalyst of Component (C) may be an effective amount for curing (the so-called catalytic amount), and usually, it is preferably 0.1 to 500 ppm in terms of a mass of the platinum group metal per 100 parts by mass of the total mass of Component (A) and Component (B), and particularly preferably in the range of 0.5 to 100 ppm.

Examples of the condensation curing type silicone resin may be mentioned a composition containing (A-1) an organopolysiloxane represented by the following average composition formula (3):

$$R^1_a(OX)_b SiO_{(4-a-b)/2} \quad (3)$$

(wherein, $R^1$ is independently an alkyl group, an alkenyl group, an aryl group or a halogen-substituted group thereof, having 1 to 12 carbon atoms, or a hydrogen atom, X is independently —Si($R^2R^3R^4$) ($R^2$, $R^3$ and $R^4$ are an alkyl group, an alkenyl group, an aryl group or a halogen-substituted group thereof, or a hydrogen atom.), an alkyl group, an alkenyl group, an alkoxyalkyl group, or an acyl group, having 1 to 6 carbon atoms, or a hydrogen atom, "a" is a number of 1.00 to 1.50, "b" is a number satisfying 0<b<2, provided that 1.00<a+b<2.00.) having the maximum value of a weight average molecular weight in terms of a polystyrene of $1\times10^4$ or more, and (A-2) a condensation catalyst as a curing agent. Hereinafter, the suitable composition is explained in detail.

[(A-1) Organopolysiloxane]

Component (A-1) is an organopolysiloxane represented by the above-mentioned average composition formula (3) having the maximum value of a weight average molecular weight in terms of a polystyrene of $1\times10^4$ or more.

In the above-mentioned formula (3), the alkyl group represented by $R^1$ may be mentioned, for example, a methyl group, an ethyl group, a propyl group, a butyl group, etc. The alkenyl group may be mentioned, for example, a vinyl group. The aryl group may be mentioned, for example, a phenyl group, etc. Among these, RI is preferably a methyl group or a phenyl group. Examples of the halogen-substituted group may be mentioned a trichloromethyl group, a trifluoropropyl group, a 3,3,4,4,5,5,6,6,6-nonafluorohexyl group, etc.

In the above-mentioned formula (3), —Si($R^2R^3R^4$) represented by X is a group in which a hydroxyl group in a hydrolyzed organopolysiloxane is silylated as mentioned later, and $R^2$, $R^3$ and $R^4$ in the silyl group are each non-reactive substituted or unsubstituted monovalent hydrocarbon group, and may be exemplified by an alkyl group such as a methyl group, an ethyl group, a propyl group, etc., an alkenyl group such as a vinyl group, etc., an aryl group such as a phenyl group, etc., and a halogen-substituted organic group thereof, etc. Examples of the halogen-substituted group may be mentioned a trichloromethyl group, a trifluoropropyl group, a 3,3,4,4,5,5,6,6,6-nonafluorohexyl group, etc.

Also, in the above-mentioned formula (3), as the alkyl group represented by X, there may be mentioned, for example, a methyl group, an ethyl group, a propyl group, an isopropyl group, a butyl group, an isobutyl group, etc. As the alkenyl group, there may be mentioned, for example, a vinyl group. As the alkoxyalkyl group, there may be mentioned, for example, a methoxyethyl group, an ethoxyethyl group, a butoxyethyl group, etc. As the acyl group, there may be mentioned, for example, an acetyl group, a propionyl group, etc.

In the above-mentioned formula (3), "a" is preferably a number of 1.00 to 1.50, "b" is 0<b<2, particularly 0.01≤b≥1.0, above all, a number satisfying 0.05≤b≤0.7. When "a" is 1.00 or more, there is no fear of causing crack in the film obtained by curing the obtained composition sheet, and when it is 1.50 or less, there is no fear of deteriorating toughness of the film nor becoming brittle. When "b" is larger than 0, adhesiveness to the substrate is sufficient, and when it is less than 2, a cured film can be certainly obtained. Also, "a"+"b" is preferably 1.00≤a+b≤1.50, and more preferably 1.10≤a+b≤1.30.

The organopolysiloxane of the present component can be prepared by, for example, hydrolyzing and condensing a silane compound represented by the following general formula (4) or (5):

$$SiR^5{}_c(OR^6)_{4-c} \quad (4)$$

$$SiR^5{}_c(Cl)_{4-c} \quad (5)$$

(wherein, $R^5$s are independently the same as $R^1$ defined as mentioned above, $R^6$s are independently the same as X defined as mentioned above except for —$Si(R^2R^3R^4)$, and "c" is an integer of 1 to 3.),
or cohydrolyzing and condensing the silane compound represented by the above-mentioned general formula (4) or (5) and an alkyl silicate represented by the following general formula (6) or (7):

$$Si(OR^6)_4 \quad (6)$$

$$Si(Cl)_4 \quad (7)$$

(wherein, $R^6$s are independently the same as X defined as mentioned above except for —$Si(R^2R^3R^4)$.)
and/or a polycondensate (alkyl polysilicate) of the alkyl silicate (both are combined and hereinafter also referred to as an "alkyl(poly)silicate"). These silane compound and alkyl(poly)silicate each may be used with a single kind alone or may be used in combination of two or more kinds. In addition, the synthetic method of the organopolysiloxane of the present component is not limited by this method.

As the silane compound represented by the above-mentioned formula (4) or (5), there may be mentioned, for example, methyltrimethoxysilane, methyltriethoxysilane, ethyltrimethoxysilane, ethyltriethoxysilane, phenyltrimethoxysilane, phenyltriethoxysilane, dimethyldimethoxysilane, dimethyldiethoxysilane, diphenyldimethoxysilane, diphenyldiethoxysilane, methylphenyldimethoxysilane, methylphenyldiethoxysilane, methyldimethoxysilane, ethyldimethoxysilane, phenyldimethoxysilane, methyltrichlorosilane, ethyltrichlorosilane, phenyltrichlorosilane, dimethyldichlorosilane, diphenyldichlorosilane, methylphenyldichlorosilane, methyldichlorosilane, ethyldichlorosilane, phenyldichlorosilane, etc., preferably methyltrimethoxysilane, methyldimethoxysilane, phenyltrimethoxysilane, methyltrichlorosilane, methyldichlorosilane and phenyltrichlorosilane. These silane compounds may be used with a single kind alone or may be used in combination of two or more kinds.

As the alkyl silicate represented by the above-mentioned formula (6), there may be mentioned, for example, a tetraalkoxysilane such as tetramethoxysilane, tetraethoxysilane, tetraisopropyloxysilane, etc., and as the polycondensate (alkyl polysilicate) of the alkyl silicate, there may be mentioned, for example, methyl polysilicate, ethyl polysilicate, etc. These alkyl (poly)silicates may be used with a single kind alone or may be used in combination of two or more kinds.

Among these, since the obtained cured product becomes a material excellent in crack resistance and heat resistance, the organopolysiloxane of the present component preferably comprises 20 to 75 mol % of trialkoxysilane, trichlorosilane such as methyltrimethoxysilane, phenyltrimethoxysilane, methyltrichlorosilane, phenyltrichlorosilane, etc., and 80 to 25 mol % of dialkoxysilane, dichlorosilane such as dimethyldimethoxysilane, dimethyldichlorosilane, etc., more preferably comprises 25 to 65 mol % of trialkoxysilane, trichlorosilane and 75 to 35 mol % of dialkoxysilane, dichlorosilane.

In the preferred embodiment of the present invention, the organopolysiloxane of the present component can be obtained by subjecting the silane compound represented by the above-mentioned formula (4) to two steps of hydrolysis of primary hydrolysis and secondary hydrolysis, and condensation reaction, or by subjecting the silane compound and the alkyl (poly)silicate to two steps of hydrolysis of primary hydrolysis and secondary hydrolysis, and condensation reaction, and for example, the following conditions can be applied.

The silane compound represented by the above-mentioned formula (4) and the alkyl(poly)silicate are, in general, preferably used by dissolving in an organic solvent such as alcohols, ketones, esters, cellosolves, aromatic compounds, etc. As the organic solvent herein used, specifically, for example, an alcohol such as methanol, ethanol, isopropyl alcohol, isobutyl alcohol, n-butanol, 2-butanol, etc., is preferable, and since curability of the obtainable composition and toughness of the cured product become excellent, isobutyl alcohol is more preferable.

Further, the silane compound represented by the above-mentioned formula (4) and the alkyl(poly)silicate are preferably carried out hydrolysis condensation by using, as a primary hydrolysis catalyst, for example, an acid catalyst such as acetic acid, hydrochloric acid, sulfuric acid, etc., in combination. An amount of water to be added when subjecting to primary hydrolysis and condensation is usually 0.9 to 1.5 mol based on 1 mol of a total amount of the alkoxy group in the above-mentioned silane compound, or in the above-mentioned silane compound and the alkyl(poly)silicate, and preferably 1.0 to 1.2 mol. If the formulation amount satisfies the range of 0.9 to 1.5 mol, it becomes a material excellent in workability of the obtainable composition, and excellent in toughness of the cured product thereof.

The maximum value of weight average molecular weight in terms of polystyrenes of the organopolysiloxane which is the primary hydrolysis and condensed product is preferably $5 \times 10^3$ to $6 \times 10^4$, and particularly preferably $1 \times 10^4$ to $4 \times 10^4$.

Incidentally, here, the weight average molecular weight is to be referred to a weight average molecular weight measured by gel permeation chromatography (GPC) measured under the following conditions using polystyrenes as standard substances.

[Measurement Conditions]
Developing solvent: THF
Flow amount: 0.6 mL/min
Detector: Differential refractive index detector (RI)
Column: TSK Guard column SuperH-L
TSKgel SuperH4000 (6.0 mm I.D.×15 cm×1)
TSKgel SuperH3000 (6.0 mm I.D.×15 cm×1)
TSKgel SuperH2000 (6.0 mm I.D.×15 cm×2)
(all manufactured by Tosoh Corporation)
Column temperature: 40° C.
Sample injection amount: 20 μL (THE solution with a concentration of 0.5% by weight)

Further, depending on necessity, secondary hydrolysis and condensation reaction may be carried out. The secondary hydrolysis and condensation reaction are to produce a high-molecular weight organopolysiloxane by treating the organopolysiloxane obtained by primary hydrolysis and condensation reaction using a secondary hydrolysis and condensation catalyst.

As the secondary hydrolysis and condensation catalyst, it is an anion exchange resin and a polystyrene-based anion exchange resin is used. As the polystyrene-based anion exchange resin, Diaion (available from Mitsubishi Chemical Corporation) is suitably used, and as the product name, there may be mentioned Diaion SA series (SA10A, SA11A, SA12A, NSA100, SA20A, SA21A), Diaion PA series (PA308, PA312, PA316, PA406, PA412, PA418), Diaion HPA series (HPA25), Diaion WA series (WA10, WA20, WA21J, WA30), etc.

Among these, in particular, SA10A represented by the following structural formula (8) is suitably used. SA10A is a water-containing type polystyrene-based anion exchange resin, and the water content in SA10A is to proceed the reaction by the catalytic effect of the basic ion exchange resin of SA10A.

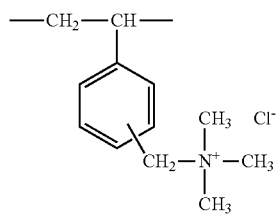

(8)

An amount of the catalyst of the secondary hydrolysis is 1% by mass to 50% by mass, preferably 5% by mass to 30% by mass based on the non-volatile component (150° C./one hour drying) of the primary hydrolysis product polysiloxane. If it is 1% by mass or more, the reaction of polymerization proceeds with a sufficient rate, while if it is 50% by mass or less, there is no fear of causing gelation. The catalyst of the secondary hydrolysis may be used with a single kind alone or may be used in combination of two or more kinds.

A temperature of the secondary hydrolysis reaction is preferably 0° C. to 40° C., and in particular, when it is 15° C. to 30° C., the reaction proceeds well. If it is 0° C. or higher, the reaction proceeds with a sufficient rate, while if it is 40° C. or lower, there is no fear of causing gelation.

In addition, the secondary hydrolysis reaction is preferably carried out in a solvent, and it is preferable to carry out the reaction by making a concentration of the solid content from 50% by mass to 95% by mass, in particular, from 65% by mass to 90% by mass. If the concentration of the solid content is 50% by mass or more, the reaction proceeds with a sufficient rate, while if it is 95% by mass or less, there is no fear of rapid reaction and causing gelation.

The solvent to be used in the secondary hydrolysis is not particularly limited, and preferably those having a boiling point of 60° C. or higher, for example, there may be mentioned a hydrocarbon-based solvent such as benzene, toluene, xylene, etc.; an ether-based solvent such as tetrahydrofuran, 1,4-dioxane, etc.; a ketone-based solvent such as methyl ethyl ketone, etc.; a halogenated hydrocarbon-based solvent such as 1,2-dichloroethane, etc.; an alcohol-based solvent such as methanol, ethanol, isopropyl alcohol, isobutyl alcohol, etc.; octamethylcyclotetrasiloxane, hexamethyldisiloxane, etc., and further, an organic solvent having a boiling point of 150° C. or higher such as cellosolve acetate, cyclohexanone, butyl cellosolve, methylcarbitol, carbitol, butylcarbitol, diethylcarbitol, cyclohexanol, diglyme, triglyme, etc., may be used. These organic solvents may be used with a single kind alone or may be used in combination of two or more kinds. As the solvent, xylene, isobutyl alcohol, diglyme and triglyme are preferred, and in particular, isobutyl alcohol is particularly preferable.

The maximum value of a weight average molecular weight of the organopolysiloxane which is a secondary hydrolysis and condensation product in terms of polystyrene is $1 \times 10^4$ or more, particularly preferably $3 \times 10^4$ to $4 \times 10^5$. If the maximum value of the weight average molecular weight is $1 \times 10^4$ or more, there is no fear of easily causing crack in the cured film and difficultly obtaining a film with a thickness of 50 μm or more.

The high molecular weight organopolysiloxane obtained by the secondary hydrolysis has a high molecular weight so that there is a problem of easily causing gelation by the condensation of the remaining hydroxyl groups. The problem of gelation can be solved by silylating the remaining hydroxyl groups to obtain a stable high molecular weight organopolysiloxane.

As the silylation method by the silyl group having a non-reactive substituent of the remaining hydroxyl groups in the organopolysiloxane, there may be exemplified by a method of reacting with trialkylhalosilane, a method of using a nitrogen-containing silylating agent such as hexaalkyldisilazane, N,N-diethylaminotrialkylsilane, N-(trialkylsilyl)acetamide, N-methyl(trialkylsilyl)acetamide, N,O-bis(trialkylsilyl)acetamide, N,O-bis(trialkylsilyl)-carbamate, N-trialkylsilylimidazole, etc., a method of reacting with trialkylsilanol, and a method of reacting with hexaalkyldisiloxane under weakly acidic conditions. When trialkylhalosilane is used, a base may be co-presented to neutralize a by-producing hydrogen halide. When a nitrogen-containing silylating agent is used, a catalyst such as trimethylchlorosilane, ammonium sulfate, etc., may be added. Specifically, a method in which trimethylchlorosilane is used as a silylating agent in the co-presence of triethylamine is suitable.

The reaction of silylation can be carried out in a solvent, but the solvent may be omitted. As a suitable solvent, there may be exemplified by an aromatic hydrocarbon solvent such as benzene, toluene, xylene, etc., an aliphatic hydrocarbon solvent such as hexane, heptane, etc., an ether-based solvent such as diethyl ether, tetrahydrofuran, etc., a ketone-based solvent such as acetone, methyl ethyl ketone, etc., an ester-based solvent such as ethyl acetate, butyl acetate, etc., a halogenated hydrocarbon solvent such as chloroform, trichloroethylene, carbon tetrachloride, etc., and further dimethylformamide, dimethylsulfoxide, etc. A reaction temperature of such a silylation is suitably 0° C. to 150° C., and preferably 0° C. to 60° C.

Since the high molecular weight organopolysiloxane of Component (A-1) obtained by the above-mentioned manufacturing method is used, the cured film has high strength, flexibility and adhesiveness of which are good, and has excellent characteristics that are capable of forming a thick sheet with 50 μm or more.

[(A-2) Condensation Catalyst]

The condensation catalyst of Component (A-2) is a component necessary for curing the organopolysiloxane of Component (A-1). The condensation catalyst is not particularly limited, and in general, an organometallic catalyst is used since it is excellent in stability of the organopolysiloxane, and hardness and no yellowing of the obtained cured product. As the organometallic catalyst, for example, those containing an atom such as zinc, aluminum, titanium, tin, cobalt, etc., are mentioned, preferably those containing a zinc, aluminum or titanium atom, and specifically zinc organic acid, a Lewis acid catalyst, an aluminum compound, an organic titanium compound, etc., can be suitably used, and specifically zinc octylate, zinc benzoate, zinc p-tert-butylbenzoate, zinc laurate, zinc stearate, aluminum chloride, aluminum perchlorate, aluminum phosphate, aluminum triisopropoxide, aluminum acetylacetonate, aluminum butoxybisethylacetoacetate, tetrabutyl titanate, tetraisopropyl titanate, tin octylate, cobalt naphthenate, tin naphthenate, etc., are exemplified, above all and specifically aluminum acetylacetonate or Acetope A1-MX3 (available from Hope Chemical Co., Ltd.) is preferably used. These condensation catalysts may be used with a single kind alone or may be used in combination of two or more kinds.

An addition amount of the condensation catalyst of Component (A-2) is preferably 0.05 to 10 parts by mass, particularly 0.1 to 5 parts by mass based on 100 parts by mass of the organopolysiloxane of Component (A-1). If the addition amount is 0.05 part by mass or more, there is no fear that curability becomes poor, while if it is 10 parts by mass or less, there is no fear of causing gelation.

<Epoxy Resin>

In the present invention, the epoxy resin which can be used as the insulating resin is not particularly limited and there may be mentioned a conventionally known epoxy resin which is a liquid or a solid at room temperature including, for example, a bisphenol A type epoxy resin, a bisphenol F type epoxy resin, a biphenol type epoxy resin such as a 3,3',5,5'-tetramethyl-4,4'-biphenol type epoxy resin and a 4,4'-biphenol type epoxy resin, a phenol novolac type epoxy resin, a cresol novolac type epoxy resin, a bisphenol A novolac type epoxy resin, a naphthalene diol type epoxy resin, a trisphenylolmethane type epoxy resin, a tetrakisphenylolethane type epoxy resin, an epoxy resin in which an aromatic ring of the phenol dicyclopentadiene novolac type epoxy resin is hydrogenated, and an alicyclic epoxy resin, etc. In addition, depending on necessity, an epoxy resin other than the above-mentioned may be used in combination depending on the purposes.

The epoxy resin can be made an insulating resin composition containing an epoxy resin, and in the composition, a curing agent of the epoxy resin may be contained. As such a curing agent, a phenol novolac resin, various kinds of amine derivatives, and a material in which acid anhydride or an acid anhydride group is partially ring-opened to form a carboxylic acid, etc., can be used. Among these, a phenol novolac resin is preferably used. In particular, it is preferable to mix them with a mixing ratio of the epoxy resin and the phenol novolac resin in which a ratio of the epoxy group and the phenolic hydroxyl group becomes 1:0.8 to 1.3.

Further, for promoting the reaction of the epoxy resin and the curing agent, as a reaction promoter (catalyst), imidazole derivatives, phosphine derivatives, amine derivatives, a metallic compound such as an organic aluminum compound, etc., may be used.

To the insulating resin composition containing the epoxy resin, various kinds of additives can be further formulated depending on necessity. For example, for the purpose of improving characteristics of the resin, additives such as various thermoplastic resins, thermoplastic elastomers, organic synthetic rubbers, low stress agents such as silicone-based, etc., waxes, halogen trapping agents, etc., can be appropriately formulated depending on the purposes.

<Maleimide Resin>

As the maleimide resin to be suitably used as the insulating resin of the present invention, there may be mentioned, for example, a maleimide compound represented by the following general formula (9).

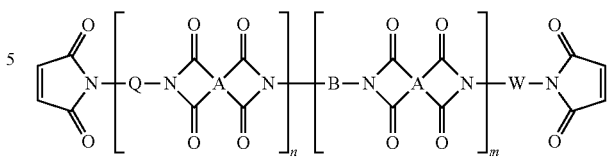

In the general formula (9), "A"s independently represent a tetravalent organic group containing a cyclic structure. "B"s independently represent an alkylene group having 6 or more carbon atoms which may contain a divalent hetero atom. "Q"s independently represent an arylene group having 6 or more carbon atoms which may contain a divalent hetero atom. "W" is the same as "B" or "Q". "n" is a number of 0 to 100, and "m" is a number of 0 to 100.

"A" in the general formula (9) represents a tetravalent organic group containing a cyclic structure, in particular, it is preferably any of tetravalent organic groups represented by the following structural formulae.

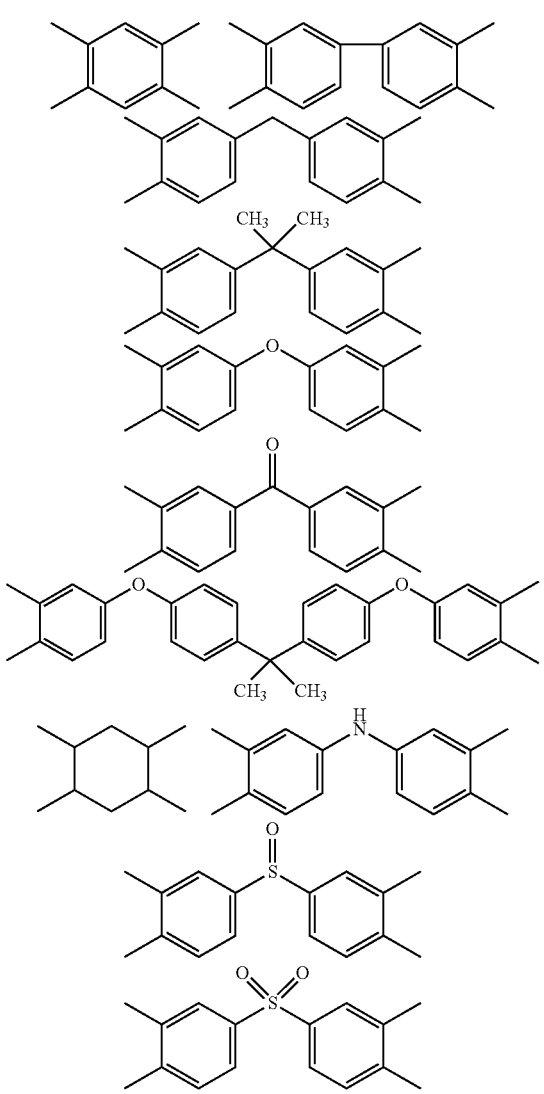

(wherein, a bonding arm to which no substituent is bonded in the above-mentioned structural formulae is to be bonded to a carbonyl carbon which forms a cyclic imide structure in the general formula (9).)

Also, "B" in the general formula (9) independently represent an alkylene group having 6 or more carbon atoms which may contain a divalent hetero atom, and preferably an alkylene group having 8 or more carbon atoms. "B" in the general formula (9) is further preferably any of alkylene groups having an aliphatic ring represented by the following structural formulae.

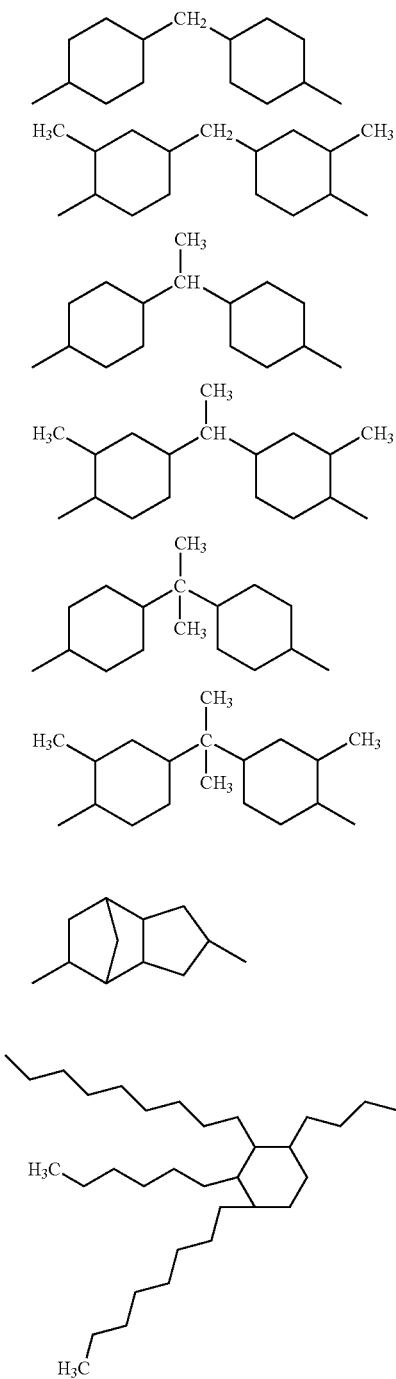

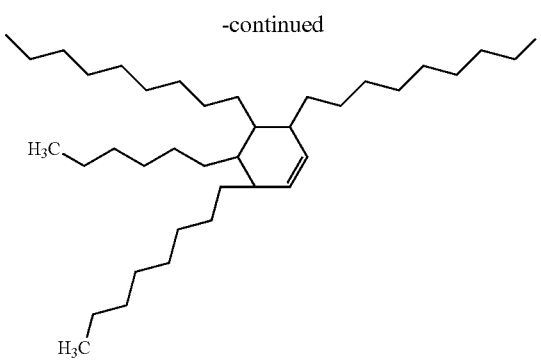

(wherein, a bonding arm to which no substituent is bonded in the above-mentioned structural formulae is to be bonded to a nitrogen atom which forms a cyclic imide structure in the general formula (9).)

"Q"s independently represent an arylene group having 6 or more carbon atoms which may contain a divalent hetero atom, and preferably an arylene group having 8 or more carbon atoms. "Q" in the formula (9) is further preferably any of arylene groups having an aromatic ring represented by the following structural formulae.

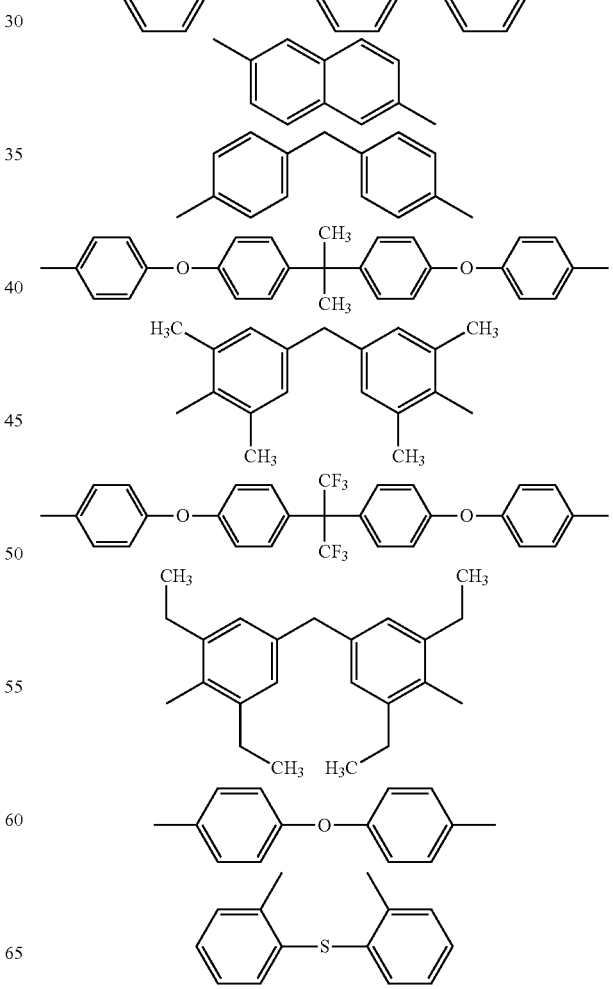

-continued

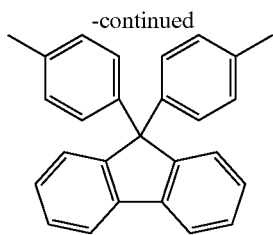

"n" in the general formula (9) is a number of 0 to 100, and preferably a number of 0 to 70. "m" in the general formula (9) is a number of 0 to 100, and preferably a number of 0 to 70. Provided that at least one of "n" or "m" is a positive number.

As the high molecule maleimide, commercially available products such as BMI-2500, BMI-2560, BMI-3000, BMI-5000, BMI-6000, BMI-6100 (hereinabove available from Designer Molecules Inc.), etc., can be used. Also, the cyclic imide compound may be used with a single kind alone or in combination of two or more kinds.

In order to cure the above-mentioned maleimide resin, a composition may be prepared by adding a reaction initiator. The reaction initiator is not particularly limited and may be mentioned a thermal radical polymerization initiator, a thermal cation polymerization initiator, a thermal anion polymerization initiator, and a photopolymerization initiator, etc.

As thermal radical polymerization initiator, there may be mentioned, for example, an organic peroxide such as methyl ethyl ketone peroxide, methylcyclohexanone peroxide, methylacetacetate peroxide, acetylacetone peroxide, 1,1-bis(t-butylperoxy) 3,3,5-trimethylcyclohexane, 1,1-bis(t-hexylperoxy)cyclohexane, 1,1-bis(t-hexylperoxy) 3,3,5-trimethylcyclohexane, 1,1-bis(t-butylperoxy)cyclohexane, 2,2-bis(4,4-di-t-butylperoxycyclohexyl) propane, 1,1-bis(t-butylperoxy)cyclododecane, n-butyl 4,4-bis(t-butyl-peroxy) valerate, 2,2-bis(t-butylperoxy)butane, 1,1-bis(t-butylperoxy)-2-methylcyclohexane, t-butyl hydroperoxide, p-menthane hydroperoxide, 1,1,3,3-tetramethylbutyl hydroperoxide, t-hexyl hydroperoxide, dicumyl peroxide, 2,5-dimethyl-2,5-bis(t-butylperoxy)hexane, α,α'-bis(t-butyl-peroxy)diisopropylbenzene, t-butylcumyl peroxide, di-t-butyl peroxide, 2,5-dimethyl-2,5-bis(t-butylperoxy) hexyne-3, isobutyryl peroxide, 3,5,5-trimethylhexanoyl peroxide, octanoyl peroxide, lauroyl peroxide, cinnamoyl peroxide, m-toluoyl peroxide, benzoyl peroxide, diisopropylperoxydicarbonate, bis(4-t-butylcyclohexyl)peroxydicarbonate, di-3-methoxy-butylperoxydicarbonate, di-2-ethylhexylperoxydicarbonate, di-sec-butylperoxydicarbonate, di(3-methyl-3-methoxybutyl)peroxydicarbonate, di(4-t-butylcyclohexyl)-peroxydicarbonate, α,α'-bis(neodecanoylperoxy)diisopropylbenzene, cumylperoxyneodecanoate, 1,1,3,3,-tetra-methylbutylperoxyneodecanoate, 1-cyclohexyl-1-methylethylperoxyneodecanoate, t-hexylperoxyneodecanoate, t-butylperoxyneodecanoate, t-hexylperoxypivalate, t-butylperoxypivalate, 2,5-dimethyl-2,5-bis(2-ethylhexanoylperoxy)hexane, 1,1,3,3-tetramethylbutylperoxy-2-ethylhexanoate, 1-cyclohexyl-1-methylethylperoxy-2-ethylhexanoate, t-hexylperoxy-2-ethylhexanoate, t-butylperoxy-2-ethylhexanoate, t-butylperoxyisobutyrate, t-butylperoxymaleic acid, t-butylperoxylaurate, t-butylperoxy-3,5,5-trimethylhexanoate, t-butylperoxyisopropylmonocarbonate, t-butylperoxy-2-ethylhexylmonocarbonate, 2,5-dimethyl-2,5-bis(benzoylperoxy)hexane, t-butylperoxyacetate, t-hexylperoxybenzoate, t-butylperoxy-m-toluoylbenzoate, t-butylperoxybenzoate, bis(t-butylperoxy)isophthalate, t-butylperoxyallylmonocarbonate, 3,3',4,4'-tetra(t-butylperoxycarbonyl)benzophenone, etc., an azo compound such as 2,2'-azobis(N-butyl-2-methylpropionamide), 2,2'-azobis(N-cyclohexyl-2-methylpropionamide), 2,2'-azobis[N-(2-methylpropyl)-2-methylpropionamide], 2,2'-azobis[N-(2-methylethyl)-2-methylpropionamide], 2,2'-azobis(N-hexyl-2-methylpropionamide), 2,2'-azobis(N-propyl-2-methylpropionamide), 2,2'-azobis(N-ethyl-2-methylpropionamide), 2,2'-azobis[2-methyl-N-(2-hydroxyethyl) propionamide], 2,2'-azobis[N-(2-propenyl)-2-methylpropionamide], 2,2'-azobis{2-methyl-N-[1,1-bis(hydroxymethyl)-2-hydroxyethyl]propionamide}, 2,2'-azobis[N-(2-propenyl)-2-methylpropionamide], dimethyl-1,1'-azobis(1-cyclohexanecarboxylate), etc., preferably dicumyl peroxide, di-t-butyl peroxide, isobutyryl peroxide, 2,2'-azobis(N-butyl-2-methylpropionamide) or 2,2'-azobis[N-(2-methylethyl)-2-methylpropionamide], and further preferably dicumyl peroxide, di-t-butyl peroxide or isobutyryl peroxide.

As thermal cation polymerization initiator, there may be mentioned, for example, an aromatic iodonium salt such as (4-methylphenyl) [4-(2-methylpropyl)phenyl]iodonium cation, (4-methylphenyl)(4-isopropylphenyl)iodonium cation, (4-methylphenyl)(4-isobutyl)iodonium cation, bis(4-tert-butyl)iodonium cation, bis(4-dodecylphenyl)iodonium cation, (2,4,6-trimethylphenyl) [4-(1-methylethylacetate ether)-phenyl]iodonium cation, etc., and an aromatic sulfonium salt such as diphenyl[4-(phenylthio)phenyl]sulfonium cation, triphenylsulfonium cation, alkyltriphenylsulfonium cation, etc., preferably (4-methylphenyl)[4-(2-methylpropyl)phenyl]iodonium cation, (4-methylphenyl)(4-isopropylphenyl)iodonium cation, triphenylsulfonium cation, alkyltriphenylsulfonium cation, and further preferably (4-methylphenyl) [4-(2-methylpropyl)phenyl]iodonium cation or (4-methylphenyl)(4-isopropylphenyl)iodonium cation.

As thermal anion polymerization initiator, there may be mentioned, for example, imidazoles such as 2-methylimidazole, 2-ethylimidazole, 2-phenylimidazole, 2-ethyl-4-methylimidazole, 2-undecylimidazole, 1-cyanoethyl-2-ethyl-4-methylimidazole, etc., amines such as triethylamine, triethylenediamine, 2-(dimethylaminomethyl)phenol, 1,8-diaza-bicyclo(5,4,0)undecene-7, tris(dimethylaminomethyl)-phenol, benzyldimethylamine, etc., and phosphines such as triphenylphosphine, tributylphosphine, trioctylphosphine, etc., preferably 2-methylimidazole, 2-ethyl-4-methylimidazole, triethylamine, triethylenediamine, 1,8-diazabicyclo(5,4,0)undecene-7, triphenylphosphine or tributylphosphine, and further preferably 2-ethyl-4-methylimidazole, 1,8-diaza-bicyclo(5,4,0)undecene-7 or triphenylphosphine.

The photopolymerization initiator is not particularly limited and there may be mentioned a benzoyl compound (or a phenyl ketone compound) such as benzophenone, etc., in particular, a benzoyl compound (or a phenyl ketone compound) having a hydroxy group on the a-position carbon atom of the carbonyl group such as 1-hydroxycyclohexylphenyl ketone, 2-hydroxy-2-methyl-1-phenylpropan-1-one, 1-(4-isopropylphenyl)-2-hydroxy-2-methylpropan-1-one, etc.; an x-alkylaminophenone compound such as 2-methyl-1-(4-methylthiophenyl)-2-morpholinopropan-1-one, 2-benzyl-2-dimethylamino-1-(4-morpholinophenyl)-1-butanone, 2-dimethylamino-2-(4-methyl-benzyl)-1-(4-morpholin-4-yl-phenyl)-butan-1-one, etc.; an acylphosphine oxide compound such as 2,4,6-trimethylbenzoyldiphenylphosphine oxide, bisacylmonoorganophosphine oxide, bis(2,6-dimethoxy-benzoyl)-2,4,4,-trimethylpentylphosphine oxide, etc.; a benzoin ether compound such as isobutylbenzoin ether, etc.; a ketal compound such as acetophenone diethyl ketal, etc.; a thioxanthone-based compound; an acetophenone-based compound, etc. In particular, radiation generated from UV-LED is a single wavelength so that when UV-LED is used as a light source, it is effective to use a photopolymerization initiator of an α-alkylaminophenone compound and an acylphosphine oxide compound, which has an absorption spectrum peak in the region of 340 to 400 nm.

These initiator components may be used with a single kind alone or may be used in combination of two or more kinds. A content of the initiator component is not particularly limited, and is 0.01 to 10 parts by mass, preferably 0.05 to 8 parts by mass, further preferably 0.1 to 5 parts by mass based on 100 parts by mass of the maleimide resin component. If it is in this range, the insulating resin composition can be cured sufficiently.

<White Pigment>

The white pigment is formulated to heighten whiteness necessary for the use of a reflector, etc. For example, as the white pigment, there may be mentioned titanium dioxide, rare earth oxide represented by yttrium oxide, zinc sulfate, zinc oxide and magnesium oxide, etc., and these may be used singly or in combination of several kinds.

Among these, it is preferable to use titanium dioxide for more heightening whiteness. As a unit lattice of the titanium dioxide, there are a rutile type, an anatase type and a brookite type, any of which can be used, and a rutile type is preferably used from the viewpoint of whiteness of titanium dioxide and photocatalytic ability.

Also, an average particle diameter and a shape of titanium dioxide are not limited, and the average particle diameter is preferably 0.05 to 5.0 μm, and among these, a material of 1.0 μm or less is more preferable and a material of 0.30 μm or less is further preferable.

The above-mentioned titanium dioxide is preferably a material subjected to surface treatment to heighten wettability or compatibility with the insulating resin, and dispersibility and flowability, and more preferably those subjected to surface treatment with at least one or more kind(s), in particular, with two or more kinds, selected from silica, alumina, zirconia, polyol and an organosilicon compound.

Further, in order to improve initial reflection of the insulating resin to which the white pigment has been formulated, and to heighten flowability, titanium dioxide treated by the organosilicon compound is preferable. Example of the organosilicon compound may be mentioned a monomer organosilicon compound including chlorosilane or silazane, a silane coupling agent having a reactive functional group such as an epoxy group, an amino group, etc., and an organopolysiloxane such as a silicone oil, a silicone resin, etc. Incidentally, other treatment agents to be usually used for surface treatment of titanium dioxide such as an organic acid including stearic acid, etc., may be used, surface treatment may be carried out with a treatment agent other than the above-mentioned or surface treatment may be carried out with a plurality of treatment agents.

<Hollow Particles>

As the hollow particles, there may be mentioned inorganic hollow particles, unexpanded, or expanded micro hollow particles made of an organic resin which is capable of expanding by heat, expanded hollow particles and thermally expandable microcapsule, etc. As the inorganic hollow particles, there may be mentioned silica balloons, carbon balloons, alumina balloons, aluminosilicate balloons and zirconia balloons, etc., as the unexpanded, or expanded micro hollow particles made of an organic resin which is capable of expanding by heat, and expanded hollow particles, there may be mentioned phenol resin balloons and plastic balloons, etc., and as thermally expandable microcapsule, there may be exemplified by a material constituted by having an outer shell comprising an organic resin formed by a polymer of a monomer selected from vinylidene chloride, acrylonitrile, methacrylonitrile, an acrylic acid ester and a methacrylic acid ester or a copolymer of two or more kinds of the above-mentioned monomers, and containing therein a volatile substance or a low boiling point substance such as a hydrocarbon-based solvent including isobutane, isopentane, etc.

[Electro-Conductive Particle Group]

The electro-conductive particle group 2 of the present invention is an aggregate in which the electro-conductive particles 4 are bound by a binder 3, and is a portion where two or more electro-conductive particles 4 are in contact with each other (FIG. 1).

<Electro-Conductive Particles>

The electro-conductive particles 4 are not particularly limited and are appropriately selected depending on the purpose, and there may be mentioned, for example, metal particles, metal-coated particles, electro-conductive polymer particles, etc.

Examples of the metal particles may be mentioned a metal simple substance such as gold, silver, copper, palladium, aluminum, nickel, iron, titanium, manganese, zinc, tungsten, platinum, lead, tin, etc., or an alloy such as solder, steel, stainless steel, etc. These may be each used one kind alone or in combination of two or more kinds.

Examples of the metal-coated particles may be a material in which a surface of the resin particles such as an acrylic resin, an epoxy resin, etc., is coated with a metal, or a material in which a surface of the inorganic particles such as a glass, ceramics, etc., is coated with a metal. The metal-coating method of the surface of the particles is not particularly limited, and there may be mentioned, for example, electroless plating method, sputtering method, etc.

Here, examples of the metal to coat the surface of the particles may be mentioned gold, silver, copper, iron, nickel, aluminum, etc.

Examples of the electro-conductive polymer particles may be mentioned carbon, polyacetylene nanoparticles, polypyrrole nanoparticles, etc.

Among these electro-conductive particles, metal particles are preferably used since they have low electric resistance and can be calcinated at high temperature.

The electro-conductive particles 4 only required to have electric conductivity when they are electrically connected to the circuit electrode. For example, even in the particles having an insulating film applied onto the surface of the particles, if the particles are deformed when electrically connected and the metal particles are exposed, they are the electro-conductive particles.

By the reasons as mentioned above, as the electro-conductive particles 4, those treated with a surface treatment agent such as a silane coupling agent, etc., may be used for the purpose of improving kneadability, compatibility, etc., with the binder 3.

An average particle diameter of the electro-conductive particles 4 is not particularly limited, and as a median diameter measured by a laser diffraction type particle size distribution measurement apparatus, it is preferably 0.01 to 100 μm, more preferably 0.01 to 50 μm, further preferably 0.05 to 30 μm, and extremely preferably 0.1 to 10 μm. If it is in this range, it is possible to highly fill the electro-conductive particles. In addition, two or more kinds of the electro-conductive particles 4 having different particle sizes may be used in combination.

<Binder>

The binder 3 of the electro-conductive particle group 2 of the present invention is a material to bind the electro-conductive particles 4 with each other. The binder 3 is not particularly limited, and may be mentioned, for example, a thermosetting resin, a thermoplastic resin, etc. If it is a thermosetting resin, when thermocompression bonding is carried out, it is possible to cure in the state of ensuring the electric conduction so that it becomes a highly reliable one. If it is a thermoplastic resin, by cooling it to room temperature after subjecting to thermocompression bonding, it is possible to maintain the state of ensuring the electric conduction.

Also, a kind of the resin to be used as the binder 3 may be the same as or different from the kind of the insulating resin 1 to be used in a film-state insulating resin composition (which constitutes a substrate of the anisotropic electro-conductive film 10) mentioned later. If the same kind of the resin is used, the binder 3 and the film-state insulating resin 1 can be compatible and strength of the anisotropic electro-conductive film 10 can be heightened so that it is preferable, while if the different kind of the resin is used, even if the electro-conductive composition (a mixture of the binder 3 and the electro-conductive particles 4) contains the electro-conductive particles 4, linear expansion coefficients of the electro-conductive composition and the film-state insulating resin 1 can be matched so that it is preferable.

As the thermosetting resin, there may be mentioned, for example, a silicone resin, an epoxy resin, an acrylic resin, a silicone-epoxy resin, a maleimide resin, a phenol resin, a thermosetting polyimide resin, an unsaturated polyester resin, etc., and as the thermoplastic resin, there may be mentioned, for example, a perfluoropolyether resin, a polyester resin, a polyethylene resin, a cellulose resin, a styrene resin, a polyamide resin, a polyimide resin, a melamine resin, etc., and when heat resistance and light resistance are taking into consideration, a thermosetting resin such as a silicone resin, an epoxy resin, a maleimide resin, etc., is preferable.

Further, the thermosetting resin is preferably a plastic solid or semi-solid at 25° C. in an uncured or semi-solid-state which is the so-called B-stage, and more preferably a plastic solid or semi-solid in an uncured state at 25° C. When it has such a characteristic, it can be deformed when the electronic parts are crimped, and good adhesive force to the electro-conductive particles 4 can be obtained when it is completely cured.

The electro-conductive particle group 2 can be prepared by adding 2 to 40% by mass of the binder 3 to 60 to 98% by mass of the electro-conductive particles 4 in accordance with the electro-conductive particles 4, charging in a commercially available stirring apparatus (THINKY CONDITIONING MIXER (manufactured by THINKY CORPORATION), etc.) and stirring for about 1 to 5 minutes, or uniformly mixing by using a three-roll mill (manufactured by INOUE MFG., INC., etc.).

<Particle Groups>

Here, the particle groups are portions (functional portions) to exhibit their functions in the so-called functional film. When the said functional portion is formed by one particle, a shape of the one particle becomes a spherical or semi-spherical, and contact with the device, etc., which contacts with the film, is made only at one point. That is, connection stability is not sufficient. Also, in the shape of one particle itself, there is a case of having chipping or variation in shape, and when the functional portion is formed by one particle, the chipping or variation in shape is reflected in the functional portion so that it after all adversely affects connection stability. Further in the case of one particle, if there is one missing part, the function of the portion is completely lost, therefore one particle must be necessarily arranged at the target portion, which is disadvantageous in regards to cost. To the contrary, in the anisotropic film of the present invention, since the functional portion is particle groups comprising a plurality of the particles bound by a binder, it can be contacted with the device at a plurality of points or surface, so that it can ensure stable connection with the device, etc. In addition, since the particle group comprises a plurality of the particles, chipping or variation in shape for each one particle does not affect the shape of the functional portion (that is, the particle groups), and also in this point, it can ensure stable connection with the device, etc., and further, the shape of the particle group can be changed in accordance with the shape of the electrode portion, etc., of the device.

Also, a width possessed by the particle group is preferably 1 to 1,000 μm, more preferably 3 to 800 μm, further more preferably 5 to 500 μm, and particularly preferably 10 to 100 μm. If it is in this range, the respective advantages of the insulating resin and the particle group can be used so that it is preferable. Incidentally, the width of the particle group means the maximum interval between particles of the particles belonging to one particle group.

Further, the width of the particle group must be larger than the size of the particles, preferably 5-fold or more, more preferably 10-fold or more to 1,000-fold or less. If it is in this range, function of the particles can be sufficiently exhibited as the particle group so that it is preferable.

Moreover, a theoretical average particle number of the particle group is preferably 50 to $1 \times 10^9$, more preferably 100 to $1 \times 10^8$, and further preferably 200 to $1 \times 10^7$. If it is in this range, the particle group can be easily formed to a pillar shape so that it is preferable.

Here, the theoretical average particle number is a parameter corresponding to the density (volume density) of the particles contained in the particle group, and can be obtained as follows. First, all the particles constituting the particle group are regarded as spheres, and an average volume of the particles is obtained from an average particle diameter of the particles. Then, a value obtained by dividing a volume of the particle group by the average volume is a theoretical average particle number in the particle group. Incidentally, when two or more kinds of the particles having different average particle diameters are used in combination, a weighted average value of the average particle diameters of each particle is an average particle diameter of the particles constituting the particle group.

The present inventors have found that a number of the particles in the particle group, that is, a particle density is important for the particle group to exhibit the characteristics of the particles. However, it is extremely difficult and unrealistic to actually measure the number of the particles in the particle group. The present inventors have found that, as a result of investigation, theoretical average particle number shown below is useful as an alternative parameter of the particle density.

Also, a shape of the particle group is preferably a cylindrical shape or a prismatic shape. The prismatic shape may be mentioned a triangular prism, a quadrangular prism, a pentagonal prism, a hexagonal prism, etc. The upper bottom surface and the lower bottom surface may be completely the same shape or may be different from each other.

Further, a ratio of an area of a lower surface of the particle group to an area of an upper surface of the same is preferably 0.5 to 10, more preferably 0.6 to 5, and further preferably 0.8 to 2. If it is in this range, anisotropy as a function of the particle group can be easily exhibited so that it is preferable.

Moreover, the particle group can be made to have various functions by the kind of the particles contained in the particle group. For example, as the particles, they can be made electro-conductive particles, heat conductive particles, phosphors, magnetic particles and electromagnetic wave absorbing fillers, and at this time, the particle groups become electro-conductive particle groups, heat conductive particle groups, phosphor particle groups, magnetic particle groups and electromagnetic wave absorbing filler particle groups, respectively. Hereinafter, the heat conductive particles, the phosphor, the magnetic particles and the electromagnetic wave absorbing filler which can be used in the particle group of the present invention will be explained in detail.

<Heat Conductive Particles>

The heat conductive particles is not particularly limited, and when heat conductivity is taking into consideration, it is preferable to select at least one kind from metal particles, boron nitride, aluminum nitride, silicon nitride, beryllium oxide, magnesium oxide, zinc oxide and aluminum oxide, among these, metal particles, boron nitride, aluminum nitride, aluminum oxide and magnesium oxide are preferable.

Examples of the metal particles may be mentioned a metal single substance such as gold, silver, copper, palladium, aluminum, nickel, iron, titanium, manganese, zinc, tungsten, platinum, lead, tin, etc., or an alloy such as solder, steel, stainless steel, etc. preferably silver, copper, aluminum, nickel, iron, titanium, tungsten, solder, steel and stainless steel. These may be each used a kind alone or in combination of two or more kinds.

A shape of the heat conductive particles is not particularly limited, and there may be mentioned, for example, a spherical shape, a scaly shape, a flake shape, a needle shape, a rod shape, an elliptical shape, etc., and among these, a spherical shape, a scaly shape, an elliptical shape and a rod shape are preferable, and a spherical shape, a scaly shape and an elliptical shape are further preferable.

<Phosphor>

As the phosphor, either of the inorganic phosphor and the organic phosphor can be used, and as the organic phosphor, an organic phosphor in which a complex is formed may be used. Incidentally, from the viewpoint of reliability such as heat resistance of the phosphor, etc., an inorganic phosphor is preferable.

As the inorganic phosphor, for example, a material which absorbs light from a semiconductor emission diode having a nitride-based semiconductor as a light emitting layer and changes the wavelength of the light to a different wavelength may be used. Such an inorganic phosphor may be mentioned, for example, a nitride-based phosphor and an oxynitride-based phosphor mainly activated by a lanthanoid-based element such as Eu, Ce, etc.; an alkaline earth metal halogen apatite phosphor, an alkaline earth metal halogen borate phosphor, an alkaline earth metal aluminate phosphor, an alkaline earth metal silicate phosphor, an alkaline earth metal sulfide phosphor, a rare earth sulfide phosphor, an alkaline earth metal thiogallate phosphor, an alkaline earth metal silicon nitride phosphor and a germanate phosphor mainly activated by a lanthanoid-based element such as Eu, etc., or by a transition metal-based element such as Mn, etc.; a rare earth aluminate phosphor and a rare earth silicate phosphor mainly activated by a lanthanoid-based element such as Ce, etc.; and a Ca—Al—Si—O—N-based oxynitride glass phosphor mainly activated by a lanthanoid-based element such as Eu, etc., and the like. Incidentally, these inorganic phosphors may be used alone or may be used in combination of two or more kinds. As the specific examples, the following inorganic phosphors can be exemplified but the invention is not limited to these.

As the nitride-based phosphor mainly activated by a lanthanoid-based element such as Eu, Ce, etc., $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M is one or more kinds selected from Sr, Ca, Ba, Mg and Zn), etc., can be exemplified.

As the oxynitride-based phosphor mainly activated by a lanthanoid-based element such as Eu, Ce, etc., $MSi_2O_2N_2$:Eu (M is one or more kinds selected from Sr, Ca, Ba, Mg and Zn), etc., can be exemplified.

As the alkaline earth metal halogen apatite phosphor mainly activated by a lanthanoid-based element such as Eu, etc., or a transition metal-based element such as Mn, etc., $M_5(PO_4)_3X$:Z (M is one or more kinds selected from Sr, Ca, Ba and Mg, X is one or more kinds selected from F, Cl, Br and I, Z is one or more kinds selected from Eu, Mn, and Eu and Mn), etc., can be exemplified.

As the alkaline earth metal halogen borate phosphor mainly activated by a lanthanoid-based element such as Eu, etc., or a transition metal-based element such as Mn, etc., $M_2B_5O_9X$:Z (M is one or more kinds selected from Sr, Ca, Ba and Mg. X is one or more kinds selected from F, Cl, Br and I, and Z is one or more kinds selected from Eu, Mn, and Eu and Mn), etc., can be exemplified.

As the alkaline earth metal aluminate phosphor mainly activated by a lanthanoid-based element such as Eu, etc., or a transition metal-based element such as Mn, etc., $SrAl_2O_4$:Z, $Sr_4Al_{14}O_{25}$:Z, $CaAl_2O_4$:Z, $BaMg_2Al_{16}O_{27}$:Z, $BaMg_2Al_{16}O_{12}$:Z, $BaMgAl_{10}O_{17}$:Z (Z is one or more kinds selected from Eu, Mn, and Eu and Mn), etc., can be exemplified.

As the alkaline earth metal silicate phosphor mainly activated by a lanthanoid-based element such as Eu, etc., or a transition metal-based element such as Mn, etc., (BaMg)$Si_2O_5$:Eu, (BaSrCa)$_2SiO_4$:Eu, etc., can be exemplified.

As the alkaline earth metal sulfide phosphor mainly activated by a lanthanoid-based element such as Eu, etc., or a transition metal-based element such as Mn, etc., (Ba,Sr,Ca)(Al,Ga)2S4;Eu, etc., can be exemplified.

As the rare earth sulfide phosphor mainly activated by a lanthanoid-based element such as Eu, etc., or a transition metal-based element such as Mn, etc., $La_2O_2S$:Eu, $Y_2O_2S$:Eu, $Gd_2O_2S$:Eu, etc., can be exemplified.

As the alkaline earth metal thiogallate phosphor mainly activated by a lanthanoid-based element such as Eu, etc., or a transition metal-based element such as Mn, etc., $MGa_2S_4$:Eu (M is one or more kinds selected from Sr, Ca, Ba, Mg, Zn), etc., can be exemplified.

As the alkaline earth metal silicon nitride phosphor mainly activated by a lanthanoid-based element such as Eu, etc., or a transition metal-based element such as Mn, etc., (Ca,Sr,Ba)AlSiN3:Eu, (Ca,Sr,Ba)2Si5N8:Eu, SrAlSi4N7:Eu, etc., can be exemplified.

As the germanate phosphor mainly activated by a lanthanoid-based element such as Eu, etc., or a transition metal-based element such as Mn, etc., $Zn_2GeO_4$:Mn, etc., can be exemplified.

As the rare earth aluminate phosphor mainly activated by a lanthanoid-based element such as Ce, etc., a YAG-based phosphor such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$, etc., and the like can be exemplified. Also, $Tb_3Al_5O_{12}$:Ce, $Lu_3Al_5O_{12}$:Ce, etc., in which a part or whole of Y is substituted by Tb, Lu, etc., can be also used.

As the rare earth silicate phosphor mainly activated by a lanthanoid-based element such as Ce, etc., $Y_2SiO_5$:Ce, Tb, etc., can be exemplified.

The Ca—Al—Si—O—N-based oxynitride glass phosphor is a phosphor comprising, as a base material, an oxynitride glass in which, in terms of mol %, $CaCO_3$ is 20 to 50 mol % in terms of Cao, $Al_2O_3$ is 0 to 30 mol %, SiO is 25 to 60 mol %, AlN is 5 to 50 mol %, and a rare earth oxide or a transition metal oxide is 0.1 to 20 mol %, and a total of the 5 components is 100 mol %. Incidentally, in the phosphor using oxynitride glass as a base material, a nitrogen content is preferably 15% by mass or less. Also, in addition to rare earth oxide ions, other rare earth element ions which become a sensitizer are preferably contained in the state of rare earth oxide, and preferably contained as a co-activator in the phosphor with a content in the range of 0.1 to 10 mol %.

As the other inorganic phosphors, ZnS:Eu, etc., are mentioned. Also, as the silicate-based phosphor other than the above-mentioned, $(BaSrMg)_3Si_2O_7$:Pb, $(BaMgSrZnCa)_3Si_2O_7$:Pb, $Zn_2SiO_4$:Mn, $BaSi_2O_5$:Pb, etc., are mentioned.

Also, in the above-mentioned inorganic phosphor, a material containing one or more kinds selected from Tb, Cu, Ag, Au, Cr, Nd, Dy, Co, Ni and Ti in place of Eu or in addition to Eu can be also used.

Further, as a phosphor other than the above-mentioned inorganic phosphors, if it has the same properties and effects as mentioned above, it can be used as the particles of the present invention.

Characteristics of the above-mentioned inorganic phosphor are not particularly limited, and for example, a material in a powder state ca be used. Also, a shape of the inorganic phosphor powder is not particularly limited, and there may be mentioned, for example, a spherical shape, a scaly shape, a flake shape, a needle shape, a rod shape, an elliptical shape, etc., and among these, a spherical shape, a scaly shape and a flake shape are preferable, and a spherical shape and a flake shape are more preferable.

As the organic phosphor, for example, an organic phosphor or an organic complex phosphor, etc., mainly activated by a lanthanoid-based element such as Eu, etc., can be used, and there may be used 9,10-diarylanthracene derivatives, pyrene, coronene, perylene, rubrene, 1,1,4,4-tetraphenylbutadiene, tris(8-quinolinolato)aluminum complex, tris(4-methyl-8-quinolinolato)aluminum complex, bis(8-quinolinolato) zinc complex, tris(4-methyl-5-trifluoromethyl-8-quinolinolato)aluminum complex, tris(4-methyl-5-cyano-8-quinolinolato)aluminum complex, bis(2-methyl-5-trifluoromethyl-8-quinolinolato) [4-(4-cyanophenyl)phenolato]aluminum complex, bis(2-methyl-5-cyano-8-quinolinolato) [4-(4-cyanophenyl)phenolato]aluminum complex, tris(8-quinolinolato)scandium complex, bis[8-(para-tosyl)aminoquinoline]zinc complex and cadmium complex, 1, 2, 3, 4-tetraphenylcyclopentadiene, pentaphenylcyclopentadiene, poly[2,5-diheptyloxy-p-phenylenevinylene], coumarin-based phosphor, perylene-based phosphor, pyran-based phosphor, anthrone-based phosphor, porphyrin-based phosphor, quinacridone-based phosphor, N,N'-dialkyl-substituted quinacridone-based phosphor, naphthalimide-based phosphor, N,N'-diaryl-substituted pyrrolopyrrole-based phosphor, or a phosphorescent emitter such as an Ir complex, etc., and the like can be used.

<Magnetic Particles>

As the magnetic particles, there may be suitably used ferromagnetic metal simple substance of iron, cobalt, nickel, etc., magnetic metal alloy such as stainless, magnetic stainless (Fe—Cr—Al—Si alloy), sendust (Fe—Si—Al alloy), permalloy (Fe—Ni alloy), copper-silicon (Fe—Cu—Si alloy), Fe—Si alloy, Fe—Si—B(—Cu—Nb) alloy, Fe—Si—Cr—Ni alloy, Fe—Si—Cr alloy, Fe—Si—Al—Ni—Cr alloy, etc., metal oxide such as hematite ($Fe_2O_3$), magnetite ($Fe_3O_4$), etc., ferrites such as Mn—Zn-based ferrite, Ni—Zn-based ferrite, Mg—Mn-based ferrite, Zr—Mn-based ferrite, Ti—Mn-based ferrite, Mn—Zn—Cu-based ferrite, barium ferrite, strontium ferrite, etc., and the like.

A shape of the magnetic particles is not particularly limited, and there may be mentioned, for example, a spherical shape, a scaly shape, a flake shape, a needle shape, a rod shape, an elliptical shape, and a porous shape, etc., and among these, a spherical shape, a scaly shape, an elliptical shape, a flake shape and a porous shape are preferable, and a spherical shape, a scaly shape, a flake shape and a porous shape are more preferable.

When the porous shape magnetic particles are to be obtained, they can be obtained by adding a pore adjusting agent such as calcium carbonate, etc., at the time of granulation to carry out granulation followed by calcination. In addition, by adding a material which inhibits particle growth during ferritization reaction, complicated voids can be formed inside the ferrite. Such a material may be mentioned tantalum oxide, zirconium oxide, etc.

<Electromagnetic Wave Absorbing Filler>

As the electromagnetic wave absorbing filler, a dielectric loss electromagnetic wave absorbing material represented by electro-conductive particles and carbon particles, or a magnetic inertia electromagnetic wave absorbing material represented by ferrite and soft magnetic metal powder, etc., can be applied.

As the electro-conductive particles, metal particles, electro-conductive metal oxide particles, particles comprising an electro-conductive polymer, metal-coated particles, etc., can be used.

Examples of the metal particles may be mentioned a metal simple substance such as gold, silver, copper, palladium, aluminum, nickel, iron, titanium, manganese, zinc, tungsten, platinum, lead, tin, etc., or an alloy such as solder, steel, stainless steel, etc. These may be each used a kind alone or in combination of two or more kinds.

As the metal oxide-based particles, particles comprising zinc oxide, indium oxide, tin oxide, etc., which are metal oxide having electric conductivity can be used. These may be each used with a kind alone or in combination of two or more kinds.

Examples of the particles comprising the electro-conductive polymer may be mentioned polyacetylene particles, polythiophene particles, polyacetylene particles, polypyrrole particles, or particles onto the surface of which are coated by these, etc.

Examples of the metal-coated particles may be a material in which the surface of the resin particles such as an acrylic resin, an epoxy resin, etc., is coated by a metal, or a material in which the surface of the inorganic particles such as glass, ceramic, etc., is coated by a metal. A metal coating method of the surface is not particularly limited, and may be mentioned, for example, an electroless plating method, a sputtering method, etc.

Here, examples of the metal for coating the particle surface may be mentioned gold, silver, copper, iron, nickel, aluminum, etc.

As the dielectric loss electromagnetic wave absorbing material, carbon black, acetylene black, Ketjen black, graphite, carbon nanotube, graphene, fullerene, carbon nanocoil, carbon microcoil, carbon fiber, etc., can be used.

As the soft magnetic alloy powder, those containing an iron element are preferable from the viewpoint of supply stability, a price, etc., and in particular, those containing 15% by mass or more of an iron element are preferable. Such a soft magnetic alloy powder may be mentioned, for example, carbonyl iron, electrolytic iron, Fe—Cr-based alloy, Fe—Si-based alloy, Fe—Ni-based alloy, Fe—Al-based alloy, Fe—Co-based alloy, Fe—Al—Si-based alloy, Fe—Cr—Si-based alloy, Fe—Cr—Al-based alloy, Fe—Si—Ni-based alloy, Fe—Si—Cr—Ni-based alloy, etc., but the invention is not limited thereto. These soft magnetic metal powders may be used with a single kind alone, or may be used two or more kinds in combination. A shape of the soft magnetic alloy powder may be used either of a flat shape or a particulate shape alone, or both may be used in combination.

As the ferrite powder, specifically used are a spinel type ferrite such as Mg—Zn-based ferrite, Ni—Zn-based ferrite, Mn—Zn-based ferrite, etc., a ferroxplana (Y type, Z type) type hexagonal ferrite such as $Ba_2CO_2Fe_{12}O_{22}$, $Ba_2Ni_2Fe_{12}O_{22}$, $Ba_2Zn_2Fe_{12}O_{22}$, $Ba_2Mn_2Fe_{12}O_{22}$, $Ba_2Mg_2Fe_{12}O_{22}$, $Ba_2Cu_2Fe_{12}O_{22}$, $Ba_3CO_2Fe_{24}O_{41}$, etc., a magnetoplumbite (M type) type hexagonal ferrite having a basic composition in which an Fe element of $BaFe_{12}O_{19}$, $SrFe_{12}O_{19}$ and/or $BaFe_{12}O_{19}$, $SrFe_{12}O_{19}$ is substituted with Ti, Co, Mn, Cu, Zn, Ni or Mg, etc., but the invention is not limited to these. These ferrite powders may be used with a single kind alone or may be used two or more kinds in combination.

[Anisotropic Film]

Also, the anisotropic film of the present invention can be made, for example, an electro-conductive film, a heat conductive film, a phosphor film, a magnetic film, an electromagnetic wave absorbing film, a reflector film and a hollow film by selecting the kind of the particles contained in the particle groups as mentioned above. Hereinafter, an embodiment that the anisotropic film of the present invention is an anisotropic electro-conductive film is explained in detail, and the present embodiment can be also applied to a heat conductive film, a phosphor film, a magnetic film, an electromagnetic wave absorbing film, a reflector film and a hollow film, etc.

[Anisotropic Electro-Conductive Film]

The anisotropic electro-conductive film 10 of the present invention is characterized in that the electro-conductive particle groups 2 are regularly arranged, and an interval A is 1 μm to 1,000 μm, preferably 3 to 800 μm, more preferably 5 to 500 μm, and further preferably 10 to 100 μm. If it is not arranged within the range of the interval A, it is difficult to ensure insulation in the surface direction without failure while ensuring electric conductivity in the thickness direction T.

A thickness T of the anisotropic electro-conductive film 10 is preferably 1 μm to 2,000 μm, more preferably 1 μm to 500 μm, and further preferably 10 μm to 300 μm. If it is in this range, the effect due to the difference in CTE between the insulating resin 1 portion and the electro-conductive particle group 2 is small and a tip does not easily come off so that it is preferable.

Also, a thickness of the electro-conductive particle group 2 is a value determined by the thickness T of the anisotropic electro-conductive film 10, and the thickness of the electro-conductive particle group 2 is preferably 50% to 150% to the thickness T of the anisotropic electro-conductive film 10, and more preferably 70% to 100%. If the thickness of the electro-conductive particle group 2 is within this range, when the electrode is pressed from above the completed anisotropic electro-conductive film 10, it becomes easy to ensure electric conduction.

Further, the electro-conductive particle group 2 is preferably exposed in at least one surface of the anisotropic electro-conductive film 10. The thickness of the electro-conductive particle group 2 being 100% of the thickness T of the anisotropic electro-conductive film 10 means that the electro-conductive particle group 2 is exposed in the both surfaces of the anisotropic electro-conductive film 10, that is, it is penetrating. By exposing the electro-conductive particle group 2 in at least one surface, it is possible to ensure conduction without thermo-compression bonding to the anisotropic electro-conductive film 10 with a large force so that it is preferable, and more preferably the electro-conductive particle group 2 is penetrating the anisotropic electro-conductive film 10.

Also, at this time, it is more preferable that a ratio of an area of the exposed particle groups in the at least one surface is 20 to 90%. If it is in this range, the anisotropic film can reliably exhibit the intended function while maintaining high flexibility.

Further, it is preferable that a difference in a linear expansion coefficient between the insulating resin and the particle groups at −50° C. to 200° C. is 1 to 200 ppm/K.

If such a difference in the linear expansion coefficient is set, electronic parts difficultly come off from the anisotropic film by the temperature change.

Also, to the anisotropic electro-conductive film 10 of the present invention, a resin film having releasability to the insulating resin 1 may be arranged. The resin film having releasability is optimized by a kind of the insulating resin 1, and specifically mentioned a fluorine-based resin coated-PET (polyethylene terephthalate), a silicone resin coated-PET film, a fluorine-based resin film such as PTFE (polytetrafluoroethylene), ETFE (ethylene-tetrafluoroethylene), CTFE (chlorotrifluoroethylene), etc. By the resin film having releasability, handling of the anisotropic electro-conductive film 10 becomes easy, and attachment of foreign substance such as dust, etc., can be prevented.

As a method for manufacturing an anisotropic electro-conductive film 10 of the present invention, for example, a binder 3 and electro-conductive particles 4 are uniformly mixed to prepare an electro-conductive composition, and then, the electro-conductive composition is filled into a mold such as a silicon wafer substrate, etc., to which a concavo-convex pattern has been provided as in Examples mentioned later to form electro-conductive particle groups 2. Then, the electro-conductive particle groups 2 are transferred onto a film-state insulating resin 1 and pushed thereinto. Thus, the anisotropic electro-conductive film 10 can be manufactured.

Since it contains a step of embedding the particle groups into the insulating resin, it is preferable that a hardness of the particle groups is equal to or higher than the hardness of the insulating resin. According to this constitution, the particle groups can be embedded into the insulating film while maintaining its shape. Incidentally, as a hardness of the particle groups measured in accordance with the method described in JIS K 6253-3: 2012 in the embedding step, it is preferably Durometer Type A20 or more, and more preferably Durometer Type A40 to Type D50. In addition, the hardness of the insulating resin at this time is preferably Durometer Type E60 or more and more preferably Durometer Type E80 to Type D30.

Also, a hardness measured in accordance with the method described in JIS K 6253-3: 2012 after curing (that is, at the time of using the anisotropic film) is preferably within the following range. That is, a hardness of the binder is preferably Durometer Type A30 or more, and more preferably Durometer Type D40 to D95. A hardness of the particle groups is preferably Durometer Type A30 or more, and more preferably Durometer Type D40 to D95. A hardness of the insulating resin is preferably Durometer Type A20 or more, and more preferably Durometer Type D30 to D90.

Incidentally, as a method of using the anisotropic electro-conductive film 10 of the present invention, when a resin film having a releasability is arranged, after delaminating it, the anisotropic electro-conductive film 10 is sandwiched between the electrode portion of the circuit board and the electrode portion of the semiconductor, and subjecting to thermocompression bonding whereby anisotropic electric conductivity can be obtained. As a temperature at the time of heating, 100° C. to 300° C. is preferable, more preferably 120° C. to 250° C., and further preferably 150° C. to 200° C. As a pressure at the time of crimping, 0.01 MPa to 100 MPa is preferable, more preferably 0.05 MPa to 80 MPa, and further preferably 0.1 MPa to 50 MPa.

Also, a storage elastic modulus of the electro-conductive particle group 2 at thermocompression bonding temperature is preferably 0.7-fold or more of a storage elastic modulus of the anisotropic electro-conductive film 10, and preferably 1.0-fold or more. If it is in this range, the viscosity of the insulating resin 1 is lowered by heating, and it becomes easy to press the electrode portion of a semiconductor to the electrode portion of the circuit board by applying a pressure. Also, in the case of the electro-conductive particles 4 which can be sintered at a low temperature, the electro-conductive particles 4 is sintered by heating, so that stable conduction can be obtained.

After obtaining the above-mentioned conduction state, the insulating resin 1 of the anisotropic electro-conductive film 10 is cured by further subjecting to heating and curing. As the curing conditions, it is preferably at 100 to 300° C. for 0.5 to 5 hours, more preferably at 150 to 250° C. for 1 to 4 hours.

<<Manufacturing Method of Anisotropic Film>>

Further, the present invention is to provide a method for manufacturing an anisotropic film, which comprises (1) preparing a composition by mixing particles and a binder, and
(2) filling the composition into a mold to which a concavo-convex pattern has been provided to produce particle groups in which a plurality of the particles are bound together.

Hereinafter, an embodiment that the particles are electro-conductive particles, the particle groups are electro-conductive particle groups and the anisotropic film is the anisotropic electro-conductive film is mentioned as an example and explained. The present embodiment can be also similarly applied to the case where the particles are heat conductive particles, phosphors, magnetic particles, electromagnetic wave absorbing fillers, etc.

[Anisotropic Electro-Conductive Film by Manufacturing Method of Present Invention]

FIG. 1 is an image diagram showing an example of an anisotropic electro-conductive film manufactured by the manufacturing method of the present invention. The anisotropic electro-conductive film 10 according to the present invention contains an insulating resin 1 and electro-conductive particle groups 2. The electro-conductive particle groups 2 contain electro-conductive particles 4 bound by a binder 3, and regularly arranged with an equal interval.

Such an anisotropic electro-conductive film can electrically connect circuit electrodes having an extremely fine pattern with each other, whereby electronic devices can be made smaller, thinner and lighter, can withstand thermal shock, etc., and are highly reliable.

[Manufacturing Method of Anisotropic Electro-Conductive Film]

[Step 1 (Preparation Step)]

As a manufacturing method of the anisotropic electro-conductive film 10 of the present invention, firstly it has a step of mixing electro-conductive particles 4 and a binder 3 to prepare an electro-conductive composition. Hereinafter described in detail.

As the electro-conductive particles and the binder herein used, the same as those explained in the portion of the anisotropic film can be used.

[Method for Preparing Electro-Conductive Composition by Mixing Electro-Conductive Particles and Binder]

A method for preparing the electro-conductive composition by mixing the electro-conductive particles 4 and the binder 3 is not particularly limited, and it can be prepared by adding the binder 3 with a ratio of 2 to 40% by mass to 60 to 98% by mass of the electro-conductive particles 4, charging the mixture in a commercially available stirring apparatus (THINKY CONDITIONING MIXER (manufactured by THINKY CORPORATION), etc.) and stirring for about 1 to 5 minutes, or uniformly mixing by using a three-roll mill (manufactured by INOUE MFG., INC., etc.). When the viscosity of the electro-conductive composition is high, a solvent into which the electro-conductive particles 4 or the binder 3 is dissolved may be added.

The characteristics of the electro-conductive composition are appropriately selected by the method of filling the electro-conductive composition into a mold to which a concavo-convex pattern has been provided, which is mentioned later. For example, when the electro-conductive composition is coated at the end of the mold and filled by squeegeeing with a rubber spatula, etc., the electro-conductive composition is preferably a liquid state at 25° C., and when the electro-conductive composition is coated into a film-state and a mold is pressed to the coated film to perform filling, it is preferably a solid state or a semi-solid-state at 25° C.

[Step 2 (Filling Step)]

Subsequent to the preparation step, there is a step of filling the electro-conductive composition into a mold to which a concavo-convex pattern has been provided to prepare electro-conductive particle groups 2. Hereinafter it is described in detail.

The mold to which a concavo-convex pattern has been provided to be used in the present invention is not particularly limited, and it may be a metal mold or may be a mold in which a reverse concavo-convex pattern from the desired mold is prepared by a resist, etc., and it is templated by a resin, etc.

As the resin for producing the mold to which a concavo-convex pattern has been provided, there may be mentioned a thermoplastic resin and a thermosetting resin, and if it is a resin having a releasability to the electro-conductive particle groups 2, a transferring step mentioned below is easy so that it is preferable. In other words, it is preferable to use a resin having no tackiness or adhesiveness to the electro-conductive particle groups 2 because there is no fear that the shape of the insulating particle groups is broken in the transferring step mentioned below.

An interval of the concavity of the concavo-convex pattern is preferably 1 μm to 1,000 μm, more preferably 3 to 800 μm, further preferably 5 to 500 μm, and extremely preferably 10 to 100 μm. If such a mold is used, among the electro-conductive particle groups 2 embedded in the anisotropic electro-conductive film 10, interval A of adjacent two is the same as the interval of the concavity of the concavo-convex pattern, so that it is possible to regularly arrange the electro-conductive particle groups 2.

A method of filling the electro-conductive composition into a mold to which a concavo-convex pattern has been provided is not particularly limited, and may be mentioned, for example, the electro-conductive composition may be coated at the end of the mold, and squeegeed with rubber spatula, etc., or the electro-conductive composition may be previously coated into a film-state and a mold may be pressed to the coated film. When the former method is employed, the electro-conductive particles 4 of the electro-conductive composition can be highly filled by dissolving in a solvent, etc., so that it is preferable, while the latter method is employed, the shape of the electro-conductive composition can be easily maintained so that it is preferable.

A material obtained by performing only Step (1) and Step (2), that is, a material in which the particle groups are formed at the concavity of the mold may be made an anisotropic film, and a material obtained by further performing Step (3) and Step (4) mentioned later may be made an anisotropic film.

Also, as the particle groups to be produced, it can be the same as the particle groups explained in the portion of the anisotropic film.

Further, the particle groups can be made to have various functions by the kind of the particles contained in the particle groups. For example, as the particles, they can be electro-conductive particles, heat conductive particles, phosphors, magnetic particles and electromagnetic wave absorbing filler, and at this time, the particle groups become electro-conductive particle groups, heat conductive particle groups, phosphor particle groups, magnetic particle groups and electromagnetic wave absorbing filler particle groups, respectively. As the heat conductive particles, phosphor, magnetic particles and electromagnetic wave absorbing filler which can be used for the particle groups, those which are the same as explained in the portion of the anisotropic film can be used.

[Step 3 (Transferring Step)]

Following the filling step, it is preferable to have a step of transferring the electro-conductive particle groups 2 to an uncured film-state insulating resin composition. Hereinafter it is described in detail.

[Film-State Insulating Resin Composition]

The film-state insulating resin composition to be used in the present invention constitutes a substrate of the anisotropic electro-conductive film 10, and comprises an insulating resin 1 as an essential component, and may contain insulating inorganic particles, etc.

The insulating resin 1 to be used in the present invention is not particularly limited, and may be mentioned a thermoplastic resin such as an acrylic resin, a polyester resin, a polyethylene resin, a cellulose resin, a styrene resin, a polyamide resin, a polyimide resin, a melamine resin, etc., and a thermosetting resin such as a silicone resin, an epoxy resin, a silicone-epoxy resin, a maleimide resin, a phenol resin, a perfluoropolyether resin, etc., and the like, and if heat resistance and light resistance are taking into consideration, a thermosetting resin such as a silicone resin, an epoxy resin, a maleimide resin, etc., is preferable.

Further, the insulating resin composition is preferably a plastic solid or semi-solid at 25° C. in an uncured or semi-cured state so-called B-stage, and more preferably a plastic solid or semi-solid at 25° C. in an uncured state. If it has such a characteristic, it can be deformed when the electronic parts are crimped and good adhesive force can be obtained by completely curing.

The insulating inorganic particles are not particularly limited, and may be mentioned, for example, silica, calcium carbonate, potassium titanate, glass fiber, silica balloon, glass balloon, aluminum oxide, aluminum nitride, boron nitride, beryllium oxide, barium titanate, barium sulfate, zinc oxide, titanium oxide, magnesium oxide, antimony oxide, aluminum hydroxide, magnesium hydroxide, etc., preferably silica, aluminum oxide, aluminum nitride, boron nitride or zinc oxide. By containing these insulating inorganic particles, a coefficient of thermal expansion of the cured product of the insulating resin 1 can be lowered.

A particle size of the insulating inorganic particles is not particularly limited, and preferably 0.05 to 10 μm as a median diameter measured by a laser diffraction type particle size distribution measurement apparatus, more preferably 0.1 to 8 μm, and further preferably 0.5 to 5 μm. If it is in this range, it is possible to uniformly disperse in the insulating resin 1, and there is no sediment with a lapse of time so that it is preferable. Further, the particle size of the insulating inorganic particles is preferably 50% or less relative to the thickness T of the anisotropic electro-conductive film 10. If the particle size is 50% or less relative to the thickness T of the anisotropic electro-conductive film 10, it is easy to uniformly disperse the insulating inorganic particles into the insulating resin 1, and further it is easy to evenly coat the anisotropic electro-conductive film 10 so that it is preferable.

A content of the insulating inorganic particles is not particularly limited, and preferably 30 to 95% by mass based on the mass of the whole insulating resin composition, more preferably 40 to 90% by mass, and further preferably 50 to 85% by mass. If it is in this range, a coefficient of thermal expansion of the insulating resin composition can be effectively lowered, and it does not become brittle after molding into a film state and completely cured, so that it is preferable.

As a method for transferring the electro-conductive particle groups 2 to an uncured film-state insulating resin composition, there may be mentioned, for example, a method in which the film-state insulating resin composition is heated to 40° C. to 120° C. to have tackiness, a mold containing the electro-conductive particle groups 2 prepared in the filling step is placed thereon and cooled to 40° C. or lower and the mold is removed, etc.

As the insulating resins particularly preferably used in the present invention, among the above-mentioned materials, they are a silicone resin, an epoxy resin and a maleimide resin. Also, as the insulating inorganic particles particularly preferably used, among the above-mentioned materials, they are a white pigment and hollow particles. Specific examples of these can be mentioned those explained at the portion of the anisotropic film. Provided that the hollow particles are not limited to the inorganic particles.

[Step 4 (Embedding Step)]

Following the transferring step, it is preferable to have a step of pressing the electro-conductive particle groups 2 transferred onto the film-state insulating resin composition and embedding it into the film-state insulating resin composition. Hereinafter it is described in detail.

A method of pressing the electro-conductive particle groups 2 transferred onto the film-state insulating resin composition is not particularly limited, and may be mentioned to methods of pressing from above the electro-conductive particle groups 2 or crushing with a roller, etc. At this time, if necessary, the film may be heated to 40° C. to 120° C. to lower the elastic modulus of the film and then pressed.

Also, Step 3 (transferring step) and Step 4 (embedding step) may be carried out simultaneously. As a method for carrying out simultaneously, for example, there may be mentioned a method in which the electro-conductive composition filled in Step 2 (filling step) is once transferred to a flat rubber sheet, etc., and the rubber sheet, etc., is hot pressed into a film-state insulating resin composition state, etc.

Also, the electro-conductive particle groups 2 may be pressed after placing a protective film made of a resin on the film-state insulating resin composition. The protective film is preferably a film having releasability.

A thickness of the electro-conductive particle group 2 is preferably 50% to 150% of a thickness of the film-state insulating resin composition (the anisotropic electro-conductive film 10), more preferably 70% to 100%. If the thickness of the electro-conductive particle group 2 is within this range, when the electrode is pressed from above the completed anisotropic electro-conductive film 10, it becomes easy to ensure electric conduction.

Also, it is preferable to expose the electro-conductive particle group 2 in at least one surface of the anisotropic electro-conductive film 10. The thickness of the electro-conductive particle group 2 being 100% of the thickness T of the anisotropic electro-conductive film 10 means that the electro-conductive particle group 2 is exposed in the both surfaces of the anisotropic electro-conductive film 10, that is, it is penetrating. By exposing the electro-conductive particle group 2 in at least one surface, it is possible to ensure conduction without thermo-compression bonding to the anisotropic electro-conductive film 10 with a large force so that it is preferable, and more preferably the electro-conductive particle group 2 is penetrating the anisotropic electro-conductive film 10.

Further, at this time, it is more preferable that a ratio of an area of the exposed particle groups in the at least one surface is 20 to 90%. If it is in this range, the anisotropic film can reliably exhibit the intended function while maintaining high flexibility.

Since it contains a step of embedding the particle groups into the insulating resin, it is preferable that a hardness of the particle groups is equal to or higher than the hardness of the insulating resin. According to this constitution, the particle groups can be embedded into the insulating film while maintaining its shape. Incidentally, as a hardness of the particle groups measured in accordance with the method described in JIS K 6253-3: 2012 in the embedding step, it is preferably Durometer Type A20 or more, and more preferably Durometer Type A40 to Type D50. In addition, the hardness of the insulating resin at this time is preferably Durometer Type E60 or more and more preferably Durometer Type E80 to Type D30.

Also, a hardness measured in accordance with the method described in JIS K 6253-3: 2012 after curing (that is, at the time of using the anisotropic film) is preferably within the following range. That is, a hardness of the binder is preferably Durometer Type A30 or more, and more preferably Durometer Type D40 to D95. A hardness of the particle groups is preferably Durometer Type A30 or more, and more preferably Durometer Type D40 to D95. A hardness of the insulating resin is preferably Durometer Type A20 or more, and more preferably Durometer Type D30 to D90.

As mentioned above, with regard to the manufacturing method of the anisotropic film of the present invention, the anisotropic electro-conductive film is mainly explained as an example as one embodiment thereof, and the above-mentioned contents can be also applied any of the manufacturing methods of an anisotropic heat conductive film, an anisotropic phosphor film, an anisotropic magnetic film, an anisotropic electromagnetic wave absorbing film, an anisotropic reflector film and an anisotropic hollow film.

EXAMPLE

Hereinafter, Synthetic Examples, Examples and Comparative Examples are shown and the present invention is explained in more detail, but the present invention is not limited to the following Examples.

In the following Examples, the weight average molecular weight is a weight average molecular weight measured by gel permeation chromatography (GPC)under the following conditions using polystyrenes as standard substances. Also, in the following Synthetic Examples, Me is a methyl group, Ph is a phenyl group and Vi is a vinyl group.

[Measurement Conditions]
Developing solvent: THF (tetrahydrofuran)
Flow amount: 0.6 mL/min
Detector: Differential refractive index detector (RI)
Column: TSK Guard column SuperH-L
TSKgel SuperH4000 (6.0 mm I.D.×15 cm×1)
TSKgel SuperH3000 (6.0 mm I.D.×15 cm×1)
TSKgel SuperH2000 (6.0 mm I.D.×15 cm×2)
(all manufactured by Tosoh Corporation)
Column temperature: 40° C.
Sample injection amount: 20 μL (THE solution with a concentration of 0.5% by mass)
Synthesis of Insulating Resin Synthetic Example 1

Synthesis of Alkenyl Group-Containing Organopolysiloxane

In a toluene solvent were dissolved 1142.1 g (87.1 mol %) of Phenyltrichlorosilane, 529 g (3.2 mol %) of ClMe$_2$SiO (Me$_2$SiO)$_{33}$SiMe$_2$Cl and 72.4 g (9.7 mol %) of dimethylvinylchlorosilane, the solution was added dropwise in water to carry out co-hydrolysis, further the mixture was washed with water and neutralized by alkali washing, followed by dehydration, and the solvent was distilled off under reduced pressure to obtain a phenyl group-containing vinylsilicone resin A1 which was a solid state at 25° C. and having a softening point of 45° C. The weight average molecular weight was 63,000. As a result of analyzing the obtained silicone resin A1, it was found that it was a silicone resin represented by the following structural formula:

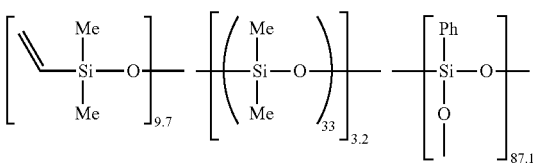

(wherein, the dimethylsiloxy unit represents that it has a continuous block structure).

Synthetic Example 2

Synthesis of Organohydrogen Polysiloxane

In a toluene solvent were dissolved 1142.1 g (87.1 mol %) of phenyltrichlorosilane, 529 g (3.2 mol %) of ClMe$_2$SiO(Me$_2$SiO)$_{33}$SiMe$_2$Cl and 69 g (9.7 mol %) of methyldichlorosilane, the solution was added dropwise in water to carry out co-hydrolysis, further the mixture was washed with water and neutralized by alkali washing, followed by dehydration, and the solvent was distilled off under reduced pressure to obtain a phenyl group-containing hydrogensilicone resin A2 which was a solid state at 25° C. and having a softening point of 40° C. The weight average molecular weight was 58,000. As a result of analyzing the obtained silicone resin A2, it was found that it was a silicone resin represented by the following structural formula:

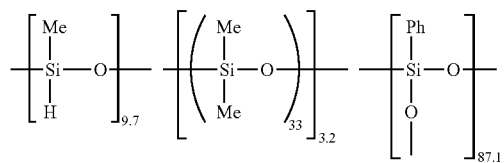

(wherein, the dimethylsiloxy unit represents that it has a continuous block structure).

Synthetic Example 3

Synthesis of Bismaleimide

To 196 g of acetone were added 144 g (1.0 mol) of 1,8-diaminooctane and 196 g (2.0 mol) of anhydrous maleic acid, and the mixture was stirred at room temperature for 3 hours. From the obtained solution, acetone was distilled off at 50° C. under reduced pressure, 82 g (1.0 mol) sodium acetate and 204 g (2.0 mol) of anhydrous acetic acid were added, and the resulting mixture was stirred at 80° C. for 1 hour. Thereafter, 500 g of toluene was added thereto, further the mixture was washed with water, followed by dehydration, and the solvent was distilled off under reduced pressure to obtain an α, ω-bismaleimideoctane A3 which was a solid state at 25° C. and having a softening point of 80° C.

Preparation of Composition (Paste)

Preparation Example 1

Ten grams of the vinylsilicone resin A1 synthesized in Synthetic Example 1, 10 g of the hydrogensilicone resin A2 synthesized in Synthetic Example 2, 0.2 mg of platinum(0)-1,3-divinyltetramethyldisiloxane complex (platinum concentration: 1% by mass), 60 mg of ethynylcyclohexanol, 10 g of toluene and 120 g of silver filler (average particle diameter: 1.5 μm) were mixed to prepare a silver paste 1.

Preparation Example 2

Ten grams of the α, ω-bismaleimideoctane A3 synthesized in Synthetic Example 3, 5 g of toluene and 100 g of copper filler (average particle diameter: 1.5 μm) were mixed to prepare a copper paste.

Preparation Example 3

Ten grams of an epoxy resin (jER-1256, available from Mitsubishi Chemical Corporation), 20 g of cyclohexanone and 30 g of silver nanofiller (average particle diameter: 20 nm) were mixed to prepare a silver paste 2.

Preparation Example 4

Ten grams of an epoxy resin (jER-1256, available from Mitsubishi Chemical Corporation), 20 g of cyclohexanone, 80 g of silver filler (average particle diameter: 5 μm) and 10 g of silver nanofiller (average particle diameter: 20 nm) were mixed to prepare a silver paste 3.

Preparation Example 5

Ten grams of BMI-1500 (available from Designer Molecules Inc.), 5 g of toluene and 80 g of aluminum nitride (average particle diameter: 2 μm) were mixed to prepare a heat conductive particle paste.

Preparation Example 6

Ten grams of the vinylsilicone resin A1 synthesized in Synthetic Example 1, 10 g of the hydrogensilicone resin A2 synthesized in Synthetic Example 2, 0.2 mg of platinum(0)-1,3-divinyltetramethyldisiloxane complex (platinum concentration 1% by mass), 60 mg of ethynylcyclohexanol, 10 g of toluene and 20 g of yellow phosphor YAG (available from Mitsubishi Chemical Corporation, average particle diameter: 2 μm) were mixed to prepare a yellow phosphor paste.

Preparation Example 7

Ten grams of the vinylsilicone resin A1 synthesized in Synthetic Example 1, 10 g of the hydrogensilicone resin A2 synthesized in Synthetic Example 2, 0.2 mg of platinum(0)-1,3-divinyltetramethyldisiloxane complex (platinum concentration 1% by mass), 60 mg of ethynylcyclohexanol, 10 g of toluene and 20 g of red phosphor CASN (available from Mitsubishi Chemical Corporation, average particle diameter: 2 μm) were mixed to prepare a red phosphor paste. Further, by changing the CASN to a green phosphor B-SIALON (available from Mitsubishi Chemical Corporation, average particle diameter: 3 μm), a green phosphor paste was prepared. Moreover, by changing the CASN to a blue phosphor SBCA (available from Mitsubishi Chemical Corporation, average particle diameter: 2 μm), a blue phosphor paste was prepared.

Preparation Example 8

Ten grams of BMI-3000 (available from Designer Molecules Inc.), 5 g of toluene and 80 g of Fe—Cr—Al—Si alloy (average particle diameter: 4 μm) were mixed to prepare a magnetic particle paste.

Preparation Example 9

Ten grams of BMI-5000 (available from Designer Molecules Inc.), 5 g of toluene and 80 g of Ba$_2$Co$_2$Fe$_{12}$O$_{22}$ ferrite (average particle diameter: 6 μm) were mixed to prepare an electromagnetic wave absorbing particle paste.

Preparation of Anisotropic Electro-Conductive Film

Example 1

Hundred grams of the vinylsilicone resin A1 synthesized in Synthetic Example 1, 100 g of the hydrogensilicone resin A2 synthesized in Synthetic Example 2, 2 mg of platinum (0)-1,3-divinyltetramethyldisiloxane complex (platinum concentration: 18 by mass), 600 mg of ethynylcyclohexanol and 100 g of toluene were mixed to prepare an organopolysiloxane composition. By using an automatic coating apparatus PI-1210 (manufactured by Tester Sangyo Co., Ltd.), the organopolysiloxane composition was coated onto an ETFE (ethylene-tetrafluoroethylene) film to mold into a film shape having a length of 150 mm, a width of 150 mm and a thickness of 40 µm. Thereafter, toluene was volatilized by heating at 100° C. for 30 minutes to prepare an uncured silicone resin film which is a solid state at 25° C. and having a length of 150 mm, a width of 150 mm and a thickness of 30 µm. Also, an oxide film was formed on a silicon wafer substrate, by using a conventionally known photolithography method, a concavo-convex pattern having a square and a convex pattern with a length of one side of 30 µm, a height of 30 µm and an interval of 30 µm was prepared, then, a condensation curing type silicone rubber KE-12 (available from Shin-Etsu Chemical Co., Ltd.) for making a template was poured thereinto to cure the same, whereby a silicone mold to which a concavo-convex pattern having a length of one side of 30 µm, a height of 30 µm and an interval of 30 µm which was a reverse concave pattern to that of the silicon wafer substrate was attached was prepared. The silver paste 1 prepared in Preparation Example 1 was squeegeed in a concavity of the silicone mold and dried to form silver particle groups, and transferred onto the uncured silicone resin film at 60° C. (FIG. 3). Thereafter, the uncured silicone resin film was hot pressed at 100° C. for 5 minutes to push the silver particle groups into the uncured silicone resin film (FIG. 4-1), whereby an uncured anisotropic electro-conductive film having a thickness of the film of 30 µm, and the silver particle groups being regularly arranged with a length of one side of 30 µm, a thickness of 30 µm and an interval of 30 µm was manufactured (FIG. 2). A theoretical average particle number was about 1,900, the particle groups were quadrangular prism shapes, and an area ratio of the lower surface to an area of the upper surface was about 1. Incidentally, FIG. 4-2 is an enlarged view of FIG. 4-1, and it can be understood that in the manufactured anisotropic electro-conductive film, the electro-conductive particle groups are embedded into the insulating film while maintaining their shapes.

Example 2

In the same method as in Example 1, the organopolysiloxane composition was molded into a film shape having a length of 150 mm, a width of 150 mm and a thickness of 300 µm. Thereafter, toluene was volatilized by heating at 100° C. for 30 minutes to prepare an uncured silicone resin film which is a solid state at 25° C. and having a length of 150 mm, a width of 150 mm and a thickness of 200 µm. In the same method as in Example 1, a silicone mold to which a concavo-convex pattern with a concave pattern having a length of one side of 80 µm, a height of 100 µm and an interval of 80 µm was attached was prepared. The copper paste prepared in Preparation Example 2 was squeegeed in a concavity of the silicone mold and dried to form copper particle groups, and transferred onto the uncured silicone resin film at 60° C. Thereafter, the uncured silicone resin film was hot pressed at 100° C. for 5 minutes to push the copper particle groups into the uncured silicone resin film, whereby an uncured anisotropic electro-conductive film having a thickness of the film of 200 µm, and the copper particle groups being regularly arranged with a length of one side of 80 µm, a thickness of 100 µm and an interval of 80 µm was manufactured (FIG. 5). A theoretical average particle number was about 45,000, the particle groups were quadrangular prism shapes, and an area ratio of the lower surface to an area of the upper surface was about 1.

Example 3

Hundred grams of the α,ω-bismaleimideoctane A3 synthesized in Synthetic Example 3, 1 g of t-butyl benzoyl peroxide and 100 g of xylene were mixed to prepare a maleimide resin composition. In the same method as in Example 1, the maleimide resin composition was molded into a film shape having a length of 150 mm, a width of 150 mm and a thickness of 20 µm. Thereafter, xylene was volatilized by heating at 110° C. for 30 minutes to prepare an uncured maleimide resin film which is a solid state at 25° C. and having a length of 150 mm, a width of 150 mm and a thickness of 10 µm. In the same method as in Example 1, a silicone mold to which a concavo-convex pattern with a concave pattern having a length of one side of 5 µm, a height of 5 µm and an interval of 5 µm was attached was prepared. The silver paste 2 prepared in Preparation Example 3 was squeegeed in a concavity of the silicone mold and dried to form silver particle groups, and transferred onto the uncured maleimide resin film at 80° C. Thereafter, the uncured maleimide resin film was hot pressed at 100° C. for 5 minutes to push the silver particle groups into the uncured maleimide resin film, whereby an uncured anisotropic electro-conductive film having a thickness of the film of 10 µm, and the silver particle groups being regularly arranged with a length of one side of 5 µm, a thickness of 5 µm and an interval of 5 µm was manufactured (FIG. 6). A theoretical average particle number was about $4 \times 10^6$, the particle groups were quadrangular prism shapes, and an area ratio of the lower surface to an area of the upper surface was about 1.

Example 4

Hundred grams of the epoxy resin jER-1256B40 (available from Mitsubishi Chemical Corporation, 40% by mass methyl ethyl ketone [MEK] solution), 40 g of jER-828EL (available from Mitsubishi Chemical Corporation), 0.8 g of 2-ethyl-4-methylimidazole and 40 g of MEK were mixed to prepare an epoxy resin composition. In the same method as in Example 1, the epoxy resin composition was molded into a film shape having a length of 150 mm, a width of 150 mm and a thickness of 200 µm. Thereafter, MEK was volatilized by heating at 40° C. for 30 minutes to prepare an uncured epoxy resin film which is a solid state at 25° C. and having a length of 150 mm, a width of 150 mm and a thickness of 100 µm. In the same method as in Example 1, a silicone mold to which a concavo-convex pattern with a concave pattern having a length of one side of 80 µm, a height of 80 µm and an interval of 80 µm was attached was prepared. The silver paste 3 prepared in Preparation Example 4 was squeegeed in a concavity of the silicone mold and dried to form silver particle groups, and transferred onto the uncured epoxy resin film at 30° C. Thereafter, the uncured epoxy resin film was hot pressed at 50° C. for 5 minutes to push the silver particle groups into the uncured epoxy resin film, whereby an uncured anisotropic electro-conductive film having a thickness of the film of 100 µm, and the silver particle groups being regularly arranged with a length of one side of 80 µm, a thickness of 80 µm and an interval of 80 µm was manufactured (FIG. 7). A theoretical average particle number was about 1,000, the particle groups were quadrangular prism shapes, and an area ratio of the lower surface to an area of the upper surface was about 1.

Example 5

Hundred grams of the epoxy resin jER-1256B40 (available from Mitsubishi Chemical Corporation, 40% by mass methyl ethyl ketone [MEK] solution), 40 g of jER-828EL (available from Mitsubishi Chemical Corporation), 0.8 g of 2-ethyl-4-methylimidazole and 100 g of MEK were mixed to prepare an epoxy resin composition. In the same method as in Example 1, the epoxy resin composition was molded into a film shape having a length of 150 mm, a width of 150 mm and a thickness of 10 μm. Thereafter, MEK was volatilized by heating at 40° C. for 30 minutes to prepare an uncured epoxy resin film which is a solid state at 25° C. and having a length of 150 mm, a width of 150 mm and a thickness of 3 μm. In the same method as in Example 1, a silicone mold to which a concavo-convex pattern with a concave pattern having a length of one side of 1 μm, a height of 2 μm and an interval of 1.5 μm was attached was prepared. The silver paste 2 prepared in Preparation Example 3 was squeegeed in a concavity of the silicone mold and dried to form silver particle groups, and transferred onto the uncured epoxy resin film at 30° C. Thereafter, the uncured epoxy resin film was hot pressed at 50° C. for 5 minutes to push the silver particle groups into the uncured epoxy resin film, whereby an uncured anisotropic electro-conductive film having a thickness of the film of 3 μm, and the silver particle groups being regularly arranged with a length of one side of 1 μm, a thickness of 2 μm and an interval of 1.5 μm was manufactured (FIG. 8). A theoretical average particle number was about 60,000, the particle groups were quadrangular prism shapes, and an area ratio of the lower surface to an area of the upper surface was about 1.

Example 6

Hundred grams of the α, ω-bismaleimideoctane A3 synthesized in Synthetic Example 3 and 1 g of t-butyl benzoyl peroxide were mixed while heating at 50° C. to prepare a maleimide resin composition. In the same method as in Example 1, the maleimide resin composition was molded into a film shape having a length of 150 mm, a width of 150 mm and a thickness of 500 μm while heating at 50° C., followed by cooling, to prepare an uncured maleimide resin film which is a solid state at 25° C. In the same method as in Example 1, a silicone mold to which a concavo-convex pattern with a concave pattern having a length of one side of 1,000 μm, a height of 500 μm and an interval of 1,000 μm was attached was prepared. The copper paste prepared in Preparation Example 2 was squeegeed in a concavity of the silicone mold and dried to form copper particle groups, and transferred onto the uncured maleimide resin film at 80° C. Thereafter, the uncured maleimide resin film was hot pressed at 100° C. for 5 minutes to push the copper particle groups into the uncured maleimide resin film, whereby an uncured anisotropic electro-conductive film having a thickness of the film of 500 μm, and the copper particle groups being regularly arranged with a length of one side of 1,000 μm, a thickness of 500 μm and an interval of 1,000 μm was manufactured (FIG. 9). A theoretical average particle number was about $3 \times 10^7$, the particle groups were quadrangular prism shapes, and an area ratio of the lower surface to an area of the upper surface was about 1.

Example 7

In the same method as in Example 1, the organopolysiloxane composition was molded into a film shape having a length of 150 mm, a width of 150 mm and a thickness of 900 μm. Thereafter, toluene was volatilized by heating at 100° C. for 30 minutes to prepare an uncured silicone resin film which is a solid state at 25° C. and having a length of 150 mm, a width of 150 mm and a thickness of 600 μm. In the same method as in Example 1, a silicone mold to which a concavo-convex pattern with a concave pattern having a length of one side of 500 μm, a height of 500 μm and an interval of 500 μm was attached was prepared. The silver paste 1 prepared in Preparation Example 1 was squeegeed in a concavity of the silicone mold and dried to form silver particle groups, and transferred onto the uncured silicone resin film at 60° C. Thereafter, the uncured silicone resin film was hot pressed at 100° C. for 5 minutes to push the silver particle groups into the uncured silicone resin film, whereby an uncured anisotropic electro-conductive film having a thickness of the film of 600 μm, and the silver particle groups being regularly arranged with a length of one side of 500 μm, a thickness of 500 μm and an interval of 500 μm was manufactured (FIG. 10). A theoretical average particle number was about $9 \times 10^6$, the particle groups were quadrangular prism shapes, and an area ratio of the lower surface to an area of the upper surface was about 1.

Example 8

Eighty grams of a, @-bismaleimideoctane A3 synthesized in Synthetic Example 3, 1 g of t-butyl benzoyl peroxide and 100 g of xylene were mixed to prepare a maleimide resin composition. In the same method as in Example 1, the maleimide resin composition was molded into a film shape having a length of 150 mm, a width of 150 mm and a thickness of 50 μm. Thereafter, xylene was volatilized by heating at 110° C. for 30 minutes to prepare an uncured maleimide resin film which is a solid state at 25° C. and having a length of 150 mm, a width of 150 mm and a thickness of 20 μm. In the same method as in Example 1, a silicone mold to which a concavo-convex pattern with a concave pattern having a length of one side of 5 μm, a height of 5 μm and an interval of 5 μm was attached was prepared. The silver paste 2 prepared in Preparation Example 3 was squeegeed in a concavity of the silicone mold and dried to form silver particle groups, and transferred onto the uncured maleimide resin film at 80° C. Thereafter, the uncured maleimide resin film was hot pressed at 100° C. for 5 minutes to push the silver particle groups into the uncured maleimide resin film, whereby an uncured anisotropic electro-conductive film having a thickness of the film of 20 μm, and the silver particle groups being regularly arranged with a length of one side of 5 μm, a thickness of 5 μm and an interval of 5 μm was manufactured (FIG. 11). A theoretical average particle number was about $4 \times 10^6$, the particle groups were quadrangular prism shapes, and an area ratio of the lower surface to an area of the upper surface was about 1.

Example 9

Hundred grams of BMI-3000J (available from Designer Molecules Inc.), 1 g of dicumyl peroxide, 100 g of xylene were mixed to prepare a maleimide resin composition. In the same method as in Example 1, the maleimide resin composition was molded into a film shape having a length of 150 mm, a width of 150 mm and a thickness of 600 μm. Thereafter, xylene was volatilized by heating at 110° C. for 30 minutes to prepare an uncured maleimide resin film which is a solid state at 25° C. and having a length of 150 mm, a width of 150 mm and a thickness of 500 μm. In the same method as in Example 1, a silicone mold to which a concavo-convex pattern with a hexagonal concave pattern having a length of the maximum diagonal line of 500 μm, a height of 500 μm and an interval of 50 μm was attached was prepared. The heat conductive particle paste prepared in Preparation Example 5 was squeegeed in a concavity of the silicone mold and dried to form heat conductive particle groups, and transferred onto the uncured maleimide resin film at 80° C. Thereafter, the film was hot pressed at 100° C. for 5 minutes to push the heat conductive particle groups into the uncured maleimide resin film, whereby an uncured anisotropic heat conductive film having a thickness of the film of 500 μm, and the hexagonal heat conductive particle groups being regularly arranged with a length of the maximum interval between the particles of 500 μm, a thickness of 500 μm and an interval of 50 μm was manufactured (FIG. 12). A theoretical average particle number was about $2 \times 10^6$, the particle groups are hexagonal prism shapes, and an area ratio of the lower surface to an area of the upper surface was about 1.

Example 10

Hundred grams of the vinylsilicone resin A1 synthesized in Synthetic Example 1, 100 g of the hydrogensilicone resin A2 synthesized in Synthetic Example 2,200 g of titanium dioxide PF-691 (available from Ishihara Sangyo Kaisha Ltd.), 2 mg of platinum(0)-1,3-divinyltetramethyldisiloxane complex (platinum concentration 1% by mass), 600 mg of ethynylcyclohexanol and 100 g of toluene were mixed to prepare an organopolysiloxane composition. In the same method as in Example 1, the organopolysiloxane composition was molded into a film shape having a length of 150 mm, a width of 150 mm and a thickness of 50 μm. Thereafter, toluene was volatilized by heating at 100° C. for 30 minutes to prepare an uncured silicone resin film which is a solid state at 25° C. and having a length of 150 mm, a width of 150 mm and a thickness of 40 μm. In the same method as in Example 1, a silicone mold to which a concavo-convex pattern with a concave pattern having a length of one side of 40 μm, a height of 40 μm and an interval of 40 μm was attached was prepared. The yellow phosphor paste prepared in Preparation Example 6 was squeegeed in a concavity of the silicone mold and dried to form phosphor particle groups, and transferred onto the uncured silicone resin film at 60° C. Thereafter, the uncured silicone resin film was hot pressed at 100° C. for 5 minutes to push the phosphor particle groups into the uncured silicone resin film, whereby an uncured anisotropic phosphor film attached with a reflector and having a thickness of the film of 40 μm, and the phosphor particle groups being regularly arranged with a length of one side of 40 μm, a thickness of 40 μm and an interval of 40 μm was manufactured (FIG. 13). A theoretical average particle number was about 1,900, the particle groups were quadrangular prism shapes, and an area ratio of the lower surface to an area of the upper surface was about 1.

Example 11

Hundred grams of BMI-3000J (available from Designer Molecules Inc.), 1 g of dicumyl peroxide and 100 g of xylene were mixed to prepare a maleimide resin composition. In the same method as in Example 1, the maleimide resin composition was molded into a film shape having a length of 150 mm, a width of 150 mm and a thickness of 40 μm. Thereafter, xylene was volatilized by heating at 110° C. for 30 minutes to prepare an uncured maleimide resin film which is a solid state at 25° C. and having a length of 150 mm, a width of 150 mm and a thickness of 30 μm. In the same method as in Example 1, a silicone mold to which a concavo-convex pattern with a concave pattern having a length of one side of 30 μm, a height of 30 μm and an interval of 150 μm was attached was prepared. The red phosphor paste prepared in Preparation Example 7 was squeegeed in a concavity of the silicone mold and dried to form red phosphor particle groups, and transferred onto the uncured maleimide resin film at 80° C. Thereafter, the film was hot pressed at 100° C. for 5 minutes to push the red phosphor particle groups into the uncured maleimide resin film. Then, the green phosphor paste prepared in Preparation Example 7 was squeegeed in a concavity of the silicone mold and dried to form green phosphor particle groups, and transferred onto the uncured maleimide resin film at 80° C. by displacing 30 μm from the red phosphor particle groups. Thereafter, the film was hot pressed at 100° C. for 5 minutes to push the green phosphor particle groups into the uncured maleimide resin film. Similarly, the blue phosphor paste prepared in Preparation Example 7 was transferred by displacing 30 μm and pushed into the uncured maleimide resin film, whereby an uncured anisotropic RGB phosphor film having a thickness of the film of 30 μm, and the phosphor particle groups being regularly arranged with a length of one side of 30 μm, a thickness of 30 μm, and an interval of the phosphor particle groups of 30 μm was manufactured (FIG. 14). A theoretical average particle number was about 450, the particle groups were quadrangular prism shapes, and an area ratio of the lower surface to an area of the upper surface was about 1.

Example 12

Hundred grams of BMI-3000J (available from Designer Molecules Inc.), 1 g of dicumyl peroxide were mixed to prepare a maleimide resin composition. By using an automatic coating apparatus PI-1210 (manufactured by Tester Sangyo Co., Ltd.), the maleimide resin composition was coated onto an ETFE (ethylene-tetrafluoroethylene) film while heating to 100° C. to prepare an uncured maleimide resin film which is a solid state at 25° C. and having a length of 150 mm, a width of 150 mm and a thickness of 2,000 μm. In the same method as in Example 1, a silicone mold to which a concavo-convex pattern with a circular concave pattern having a length of the diameter of 800 μm, a height of 1,500 μm and an interval of 100 μm was attached was prepared. The magnetic particles paste prepared in Preparation Example 8 was squeegeed in a concavity of the silicone mold and dried to form magnetic particle groups, and transferred onto the uncured maleimide resin film at 80° C. Thereafter, the film was hot pressed at 100° C. for 5 minutes to push the magnetic particle groups into the uncured maleimide resin film, whereby an uncured anisotropic magnetic film having a thickness of the film of 2,000 μm, and the magnetic particle groups being regularly arranged with a length of the diameter of 800 μm, a thickness of 1500 μm and an interval of 100 μm was manufactured (FIG. 15). A theoretical average particle number was about $3 \times 10^6$, the particle groups are cylindrical shape, and an area ratio of the lower surface to an area of the upper surface was about 1.

Example 13

Hundred grams of BMI-3000J (available from Designer Molecules Inc.), 1 g of dicumyl peroxide, 50 g of hollow particles SiliNax (available from Nittetsu Mining Co., Ltd., particle diameter: 80 to 130 nm) and 100 g of xylene were mixed to prepare a maleimide resin composition. In the same method as in Example 1, the maleimide resin composition was molded into a film shape having a length of 150 mm, a width of 150 mm and a thickness of 120 µm. Thereafter, xylene was volatilized by heating at 110° C. for 30 minutes to prepare an uncured maleimide resin film which is a solid state at 25° C. and having a length of 150 mm, a width of 150 mm and a thickness of 100 µm. In the same method as in Example 1, a silicone mold to which a concavo-convex pattern with a hexagonal concave pattern having a length of the maximum diagonal line of 200 µm, a height of 100 µm and an interval of 40 µm was attached was prepared. The electromagnetic wave absorbing particles paste prepared in Preparation Example 9 was squeegeed in a concavity of the silicone mold and dried to form electromagnetic wave absorbing particle groups, and transferred onto the uncured maleimide resin film at 80° C. Thereafter, the film was hot pressed at 100° C. for 5 minutes to push the electromagnetic wave absorbing particle groups into the uncured maleimide resin film, whereby an uncured hollow particles-containing anisotropic electromagnetic wave absorbing film having a thickness of the film of 100 µm, and the electromagnetic wave absorbing particle groups being regularly arranged with a length of the maximum interval between the particles of 200 µm, a thickness of 100 µm and an interval of 40 µm was manufactured (FIG. 16). A theoretical average particle number was about 2,900, the particle groups are hexagonal prism shapes, and an area ratio of the lower surface to an area of the upper surface was about 1.

Comparative Example 1

Twenty grams of the vinylsilicone resin A1 synthesized in Synthetic Example 1, 20 g of the hydrogensilicone resin A2 synthesized in Synthetic Example 2, 0.2 mg of platinum(0)-1,3-divinyltetramethyldisiloxane complex (platinum concentration: 1% by mass), 60 mg of ethynylcyclohexanol, 10 g of toluene and 1 g of electro-conductive fine particles subjected to gold-plating (Trade name: Micropearl AU, available from Sekisui Chemical Co., Ltd., average particle diameter: 7.25 µm) were mixed to prepare an organopolysiloxane composition. In the same method as in Example 1, the organopolysiloxane composition was molded into a film shape having a length of 150 mm, a width of 150 mm and a thickness of 10 µm. Thereafter, toluene was volatilized by heating at 100° C. for 30 minutes to prepare an uncured electro-conductive film which is an uncured solid state at 25° C., having a length of 150 mm, a width of 150 mm and a thickness of 8 µm, and in which the electro-conductive particles do not form the electro-conductive particle groups but present sparsely (FIG. 17).

Comparative Example 2

Ten grams of silver filler (average particle diameter: 3 µm) and 3 g of cyclopentanone were mixed, to prepare a silver paste containing no binder. In the same method as in Example 3, an uncured maleimide resin film which is a solid state at 25° C. and having a length of 150 mm, a width of 150 mm and a thickness of 30 µm was prepared. In the same method as in Example 1, a silicone mold to which a concavo-convex pattern with a concave pattern having a length of one side of 30 µm, a height of 30 µm and an interval of 30 µm was attached was prepared. The silver paste was squeegeed in a concavity of the silicone mold and dried to form silver particle groups, and when it was transferred onto the uncured maleimide resin film at 80° C., the silver particle groups were transferred in a collapsed state. Thereafter, the uncured maleimide resin film was hot pressed at 100° C. for 5 minutes to push the silver particle groups into the uncured maleimide resin film, whereby an uncured electro-conductive film having a thickness of the film of 30 µm, and the silver particle groups being sparsely presented was manufactured (FIG. 18).

Comparative Example 3

Hundred grams of the epoxy resin jER-1256B40 (available from Mitsubishi Chemical Corporation, 40% by mass methyl ethyl ketone [MEK] solution), 40 g of jER-828EL (available from Mitsubishi Chemical Corporation), 0.8 g of 2-ethyl-4-methylimidazole and 200 g of MEK were mixed to prepare an epoxy resin composition. In the same method as in Example 1, the epoxy resin composition was molded into a film shape having a length of 150 mm, a width of 150 mm and a thickness of 5 µm. Thereafter, MEK was volatilized by heating at 40° C. for 30 minutes to prepare an uncured epoxy resin film which is a solid state at 25° C. and having a length of 150 mm, a width of 150 mm and a thickness of 2 µm. In the same method as in Example 1, a silicone mold to which a concavo-convex pattern with a concave pattern having a length of one side of 1 µm, a height of 1 µm and an interval of 0.5 µm was attached was prepared. The silver paste 3 prepared in Preparation Example 4 was squeegeed in a concavity of the silicone mold and dried to form silver particle groups, and transferred onto the uncured epoxy resin film at 30° C., but the adjacent silver nanoparticles were stuck together (FIG. 19).

Comparative Example 4

In the same method as in Example 1, the organopolysiloxane composition was molded into a film shape having a length of 150 mm, a width of 150 mm and a thickness of 300 µm. Thereafter, toluene was volatilized by heating at 100° C. for 30 minutes to prepare an uncured silicone resin film which is a solid state at 25° C. and having a length of 150 mm, a width of 150 mm and a thickness of 200 µm. In the same method as in Example 1, a silicone mold to which a concavo-convex pattern with a concave pattern having a length of one side of 1,200 µm, a height of 200 µm and an interval of 1,200 µm was attached was prepared. The silver paste 1 prepared in Preparation Example 1 was squeegeed in a concavity of the silicone mold and dried to form silver particle groups, and transferred onto the uncured silicone resin film at 60° C. Thereafter, the uncured silicone resin film was hot pressed at 100° C. for 5 minutes to push the silver particle groups into the uncured silicone resin film, whereby an uncured anisotropic electro-conductive film having a thickness of the film of 200 µm, and the silver particle groups being regularly arranged with a length of one side of 1,200 µm, a thickness of 200 µm and an interval of 1,200 µm was manufactured (FIG. 20). A theoretical average particle number was about $2 \times 10^7$, the particle groups were quadrangular prism shapes, and an area ratio of the lower surface to an area of the upper surface was about 1.

[Electric Conduction Test]

The uncured anisotropic electro-conductive films manufactured in Examples 1 to 8 and Comparative Examples 1 to 4 were each stuck onto the electrode of the substrate, a flip-chip LED having 200 µm×200 µm and a thickness of 50 µm in Examples 1, 2 and 4 and Comparative Examples 1 and 2, a flip-chip LED having 20 µm×50 µm and a thickness of 10 µm in Examples 3, 5 and 8 and Comparative Example 3, and a flip-chip LED having 2,000 µm×3,000 µm and a thickness of 300 µm in Examples 6 and 7 and Comparative Example 4, were pressed thereon by a pick-and-place, and they were finally cured at 180° C. for 2 hours, respectively, to prepare test specimens. The test specimens were electric conducted and the number of lights turned on was measured. The results are shown in Table 1.

[Thermal Shock Test]

With regard to 20 test specimens after the electric conduction test, the thermal shock test was carried out 1,000 times at −40° C. to 120° C., and thereafter, the electric conduction test was again carried out and the number of lights turned on was measured. The results are shown in Table 1.

characteristics is employed, it has been clarified that circuit electrodes having an extremely fine pattern can be electrically connected and reliability thereof is high.

Further, since it is an anisotropic film having fine pattern due to particle groups, as shown in Examples 9 to 13, it can be understood that it can be applied to various uses such as an anisotropic heat conductive film, an anisotropic phosphor film, an anisotropic magnetic film, an anisotropic electromagnetic wave absorbing film, etc.

In addition, in Comparative Example 1, electro-conductive particles are mixed without using a mold to which a concavo-convex pattern has been provided. Further, in Comparative Example 2, electro-conductive particle groups are prepared without using a binder. As a result, in Comparative Example 1, no electro-conductive particle groups was formed, and in Comparative Example 2, the electro-conductive particle groups collapsed and existed sparsely. In the electric conduction tests before and after the thermal shock test, Comparative Examples 1 and 2 showed the results inferior to those of Examples 1 to 8.

Therefore, according to the manufacturing method of the anisotropic electro-conductive film of the invention, it can be clarified that circuit electrodes having an extremely fine pattern can be electrically connected, and an anisotropic

TABLE 1

|  | Example 1 | Example 2 | Example 3 | Example 4 | Example 5 | Example 6 |
|---|---|---|---|---|---|---|
| Film thickness (µm) | 30 | 200 | 10 | 100 | 3 | 500 |
| Width (µm) of electro-conductive particle groups | 30 | 80 | 5 | 80 | 1 | 1,000 |
| Thickness (µm) of electro-conductive particle groups | 30 | 100 | 5 | 80 | 2 | 500 |
| Interval (µm) of electro-conductive particle groups | 30 | 80 | 5 | 80 | 1.5 | 1,000 |
| Electric conduction test (number of lights turned on) | 20/20 | 20/20 | 20/20 | 20/20 | 19/20 | 20/20 |
| Thermal shock test (number of lights turned on) | 20/20 | 20/20 | 19/20 | 20/20 | 19/19 | 20/20 |

|  | Example 7 | Example 8 | Comparative example 1 | Comparative example 2 | Comparative example 3 | Comparative example 4 |
|---|---|---|---|---|---|---|
| Film thickness (µm) | 600 | 20 | 8 | 30 | 2 | 200 |
| Width (µm) of electro-conductive particle groups | 500 | 5 | Immeasurable | Immeasurable | Immeasurable | 1,200 |
| Thickness (µm) of electro-conductive particle groups | 500 | 5 | 7.25 | Immeasurable | Immeasurable | 200 |
| Interval (µm) of electro-conductive particle groups | 500 | 5 | Immeasurable | Immeasurable | Immeasurable | 1,200 |
| Electric conduction test (number of lights turned on) | 19/20 | 10/20 | 0/20 | 5/20 | 0/20 | 10/20 |
| Thermal shock test (number of lights turned on) | 10/19 | 10/10 | — | 0/5 | — | 1/10 |

As shown in Table 1, the anisotropic electro-conductive films of the present invention can ensure electric conduction without short-circuiting a semiconductor apparatus having fine electrodes, which are different from the conventional anisotropic electro-conductive films, and further, after the thermal shock test, they can ensure electric conduction.

Different from Comparative Examples 1 and 2, in the anisotropic electro-conductive films of Examples 1 to 8, electro-conductive particle groups containing electro-conductive particles bound by a binder are formed. Further, different from Comparative Examples 3 and 4, these electro-conductive particle groups are regularly arranged with the interval within a range of 1 µm to 1,000 µm.

From the above, when the anisotropic electro-conductive film of the present invention having the above-mentioned electro-conductive film having high reliability can be reliably manufactured with good efficiency.

Moreover, as shown in Examples 9 to 13, by changing the kind of the particle groups, it can be clarified that films such as an anisotropic heat conductive film, an anisotropic phosphor film, an anisotropic magnetic film, an anisotropic electromagnetic wave absorbing film, etc., can be reliably manufactured with good efficiency.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

The invention claimed is:

1. An anisotropic film comprising:
   an insulating resin; and
   particle groups in which a plurality of particles are bound together with a binder, the particle groups being a portion where two or more particles are in contact with each other, and being regularly arranged with an interval of 1 μm to 1,000 μm,
wherein:
   the particles are heat conductive particles, and the particle groups are heat conductive particle groups;
   the particles are phosphors, and the particle groups are phosphor particle groups;
   the particles are magnetic particles, and the particle groups are magnetic particle groups; or
   the particles are electromagnetic wave absorbing filler, and the particle groups are electromagnetic wave absorbing filler particle groups.

2. The anisotropic film according to claim 1, wherein a difference in a linear expansion coefficient between the insulating resin and the particle groups at −50° C. to 200° C. is 1 to 200 ppm/K.

3. The anisotropic film according to claim 1, wherein the binder is a resin composition having the same composition as the insulating resin.

4. The anisotropic film according to claim 1, wherein the binder is a resin composition having a different composition from the insulating resin.

5. The anisotropic film according to claim 1, wherein a thickness of the anisotropic film is 1 μm to 2,000 μm.

6. The anisotropic film according to claim 1, wherein an average particle diameter of the particles is 0.01 to 100 μm as a median diameter measured by a laser diffraction type particle size distribution measurement apparatus.

7. The anisotropic film according to claim 1, wherein the particle groups have a width of 1 to 1,000 μm.

8. The anisotropic film according to claim 1, wherein a width of the particle groups is 5-fold or more of an average particle diameter of the particles.

9. The anisotropic film according to claim 1, wherein a theoretical average particle number of the particle groups is 50 to $1\times10^9$.

10. The anisotropic film according to claim 1, wherein a shape of the particle groups is a cylindrical shape or a prismatic shape.

11. The anisotropic film according to claim 1, wherein a ratio of an area of a lower surface of the particle groups to an area of an upper surface of the same is 0.5 to 10.

12. The anisotropic film according to claim 1, wherein a thickness of the particle groups is 50% or more of a thickness of the anisotropic film.

13. The anisotropic film according to claim 1, wherein the particle groups are exposed in at least one surface of the anisotropic film.

14. The anisotropic film according to claim 1, wherein a ratio of an area of the exposed particle groups in the at least one surface is 20 to 90%.

15. The anisotropic film according to claim 1, wherein the insulating resin is a plastic solid or semi-solid material in an uncured state at 25° C.

16. The anisotropic film according to claim 1, wherein the particles contain metal particles.

17. The anisotropic film according to claim 1, wherein the insulating resin contains insulating inorganic particles.

18. The anisotropic film according to claim 1, wherein the insulating inorganic particles are a white pigment.

19. The anisotropic film according to claim 1, wherein the insulating resin contains hollow particles.

20. The anisotropic film according to claim 1, wherein a cured product of the insulating resin has a relative dielectric constant of 3.5 or less at 10 GHz.

21. The anisotropic film according to claim 1, wherein the anisotropic film is any of a heat conductive film, a phosphor film, a magnetic film, an electromagnetic wave absorbing film, a reflector film, and a hollow film.

22. A method for manufacturing an anisotropic film, the method comprising:
   (1) preparing a composition by mixing particles and a binder; and
   (2) filling the composition into a mold to which a concavo-convex pattern has been applied to produce particle groups in which a plurality of the particles are bound together.

23. The method for manufacturing an anisotropic film according to claim 22, further comprising, after the step (2):
   (3) transferring the particle groups to an uncured film-state insulating resin composition; and
   (4) pressing the particle groups transferred onto the film-state insulating resin composition to embed the particle groups into the film-state insulating resin composition.

24. The method for manufacturing an anisotropic film according to claim 23, wherein the binder used in the step (1) is a resin composition having the same composition as the film-state insulating resin composition used in the step (3).

25. The method for manufacturing an anisotropic film according to claim 23, wherein the binder used in the step (1) is a resin composition having a different composition from the film-state insulating resin composition used in the step (3).

26. The method for manufacturing an anisotropic film according to claim 22, wherein the particles are electroconductive particles, and the particle groups are electroconductive particle groups.

27. The method for manufacturing an anisotropic film according to claim 22, wherein the particles are heat conductive particles, and the particle groups are heat conductive particle groups.

28. The method for manufacturing an anisotropic film according to claim 22, wherein the particles are phosphors, and the particle groups are phosphor particle groups.

29. The method for manufacturing an anisotropic film according to claim 22, wherein the particles are magnetic particles, and the particle groups are magnetic particle groups.

30. The method for manufacturing an anisotropic film according to claim 22, wherein the particles are electromagnetic wave absorbing filler, and the particle groups are electromagnetic wave absorbing filler particle groups.

31. The method for manufacturing an anisotropic film according to claim 23, wherein the film-state insulating resin composition used in the step (3) is a plastic solid or semi-solid material in an uncured state at 25° C.

32. The method for manufacturing an anisotropic film according to claim 23, wherein the film-state insulating resin composition used in the step (3) is a material containing insulating inorganic particles.

33. The method for manufacturing an anisotropic film according to claim 32, wherein the insulating inorganic particles are a white pigment.

34. The method for manufacturing an anisotropic film according to claim 23, wherein the film-state insulating resin composition used in the step (3) is a material containing hollow particles.

35. The method for manufacturing an anisotropic film according to claim 23, wherein the concavo-convex pattern of the mold used in the step (2) produces an interval of adjacent two among the particle groups embedded in the anisotropic film of 1 μm to 1,000 μm.

36. The method for manufacturing an anisotropic film according to claim 23, wherein an average particle diameter of the particles is 0.01 to 100 μm as a median diameter measured by a laser diffraction type particle size distribution measurement apparatus.

37. The method for manufacturing an anisotropic film according to claim 22, wherein the particle groups have a width of 1 to 1,000 μm.

38. The method for manufacturing an anisotropic film according to claim 22, wherein a width of the particle groups is 5-fold or more of an average particle diameter of the particles.

39. The method for manufacturing an anisotropic film according to claim 22, wherein a theoretical average particle number of the particle groups is 50 to $1 \times 10^9$.

40. The method for manufacturing an anisotropic film according to claim 22, wherein a shape of the particle groups is a cylindrical shape or a prismatic shape.

41. The method for manufacturing an anisotropic film according to claim 22, wherein a ratio of an area of a lower surface of the particle groups to an area of an upper surface of the same is 0.5 to 10.

42. The method for manufacturing an anisotropic film according to claim 22, wherein a thickness of the particle groups is 50% or more of a thickness of the anisotropic film.

43. The method for manufacturing an anisotropic film according to claim 22, wherein the particle groups are exposed in at least one surface of the anisotropic film.

44. The method for manufacturing an anisotropic film according to claim 43, wherein a ratio of an area of the exposed particle groups in the at least one surface is 20 to 90%.

45. The method for manufacturing an anisotropic film according to claim 22, wherein the anisotropic film is any of an electro-conductive film, a heat conductive film, a phosphor film, a magnetic film, an electromagnetic wave absorbing film, a reflector film, and a hollow film.

* * * * *